US011067541B2

(12) United States Patent
Ogata et al.

(10) Patent No.: US 11,067,541 B2
(45) Date of Patent: Jul. 20, 2021

(54) ULTRASONIC SENSOR

(71) Applicant: DAI-ICHI SEIKO CO., LTD., Kyoto (JP)

(72) Inventors: Kenji Ogata, Ogori (JP); Shogo Kurogi, Ogori (JP)

(73) Assignee: DAI-ICHI SEIKO CO., LTD., Kyoto (JP)

( * ) Notice: Subject to any disclaimer, the term of this patent is extended or adjusted under 35 U.S.C. 154(b) by 0 days.

(21) Appl. No.: 16/637,407

(22) PCT Filed: Sep. 10, 2018

(86) PCT No.: PCT/JP2018/033437
§ 371 (c)(1),
(2) Date: Feb. 7, 2020

(87) PCT Pub. No.: WO2019/065182
PCT Pub. Date: Apr. 4, 2019

(65) Prior Publication Data
US 2020/0182834 A1 Jun. 11, 2020

(30) Foreign Application Priority Data
Sep. 27, 2017 (JP) .............................. JP2017-185756

(51) Int. Cl.
*G01N 29/22* (2006.01)
*G01N 29/24* (2006.01)
(Continued)

(52) U.S. Cl.
CPC ......... *G01N 29/223* (2013.01); *B06B 1/0215* (2013.01); *B81B 3/0062* (2013.01); *G01N 29/2437* (2013.01)

(58) Field of Classification Search
CPC .............. G01N 29/223; G01N 29/2437; B06B 1/0215; B06B 1/0603; B81B 3/0062;
(Continued)

(56) References Cited

U.S. PATENT DOCUMENTS 5,712,426 A * 1/1998 Sapuppo ................ G01C 19/42
73/504.02
8,979,249 B2 3/2015 Sameshima et al.
(Continued)

FOREIGN PATENT DOCUMENTS

CN 103208282 A 7/2013
CN 103477459 A 12/2013
(Continued)

OTHER PUBLICATIONS

International Search Report and Written Opinion (International Application No. PCT/JP2018/033437): dated Dec. 4, 2018; 8 pages.
(Continued)

*Primary Examiner* — Suman K Nath
(74) *Attorney, Agent, or Firm* — Howard & Howard Attorneys PLLC

(57) ABSTRACT

A fixed frame (2) is fixed to an external member. An ultrasonic oscillator (3) is disposed inside the fixed frame (2) and includes a flexible first substrate and a first piezoelectric element deposited on the first substrate in the form of a thin film. The ultrasonic oscillator (3) is warped in response to expansion or contraction of the first piezoelectric element and generates ultrasonic waves. Actuator units (4) include a flexible second substrate coupling the first substrate to the fixed frame (2) and a second piezoelectric element deposited on the second substrate in the form of a thin film. The actuator units (4) are warped in response to expansion or contraction of the second piezoelectric element and cause the ultrasonic oscillator (3) to swing relative to the fixed
(Continued)

frame (2). The fixed frame (2), the first substrate, and the second substrate are composed of the same substrate.

19 Claims, 18 Drawing Sheets

(51) Int. Cl.
*B06B 1/02* (2006.01)
*B81B 3/00* (2006.01)

(58) Field of Classification Search
CPC .... B81B 2203/0172; B81B 2201/0271; B81B 2201/032; B81B 3/0021; B81B 2203/058; H01L 41/1132; H01L 41/187; G01P 15/14
See application file for complete search history.

(56) References Cited

U.S. PATENT DOCUMENTS

| | | | |
|---|---|---|---|
| 2003/0109786 A1 | 6/2003 | Irioka et al. | |
| 2003/0196490 A1* | 10/2003 | Cardarelli | G01P 15/18 |
| | | | 73/504.02 |
| 2012/0320379 A1 | 12/2012 | Hofmann et al. | |
| 2013/0176816 A1 | 7/2013 | Nakamura | |
| 2018/0031601 A1* | 2/2018 | Anac | B81B 7/008 |
| 2018/0172982 A1 | 6/2018 | Okada et al. | |

FOREIGN PATENT DOCUMENTS

| | | |
|---|---|---|
| JP | H10-256570 A | 9/1998 |
| JP | 2001-149372 A | 6/2001 |
| JP | 2013-003583 A | 1/2013 |
| JP | 2017-003717 A | 1/2017 |
| JP | 2017-167254 A | 9/2017 |

OTHER PUBLICATIONS

Extended European Search Report (EP Application No./Patent No. 18861734.4-1001 / 3691293 PCT/JP2018033437); dated Oct. 21, 2020; 9 pages.

Notification of First Office Action (CN Application No. or Patent No. 201880062877.X); dated Dec. 1, 2020; 12 pages.

* cited by examiner

ULTRASONIC SENSOR

CROSS-REFERENCE TO RELATED APPLICATIONS

This application is a national phase of International Patent Application No. PCT/JP2018/033437, filed Sep. 10, 2018, which claims priority to JP Patent Application No. 2017-185756, filed Sep. 27, 2017, the disclosures of which are hereby incorporated by reference in their entirety.

TECHNICAL FIELD

The present disclosure relates to an ultrasonic sensor.

BACKGROUND ART

Patent Literature 1 discloses that an ultrasonic sensor equipped with an oscillator including lead zirconate titanate (also called PZT) functioning as a source (ultrasonic oscillating element) for emitting ultrasonic waves is fabricated by micro electro mechanical systems (MEMS) technology, which is thin-film manufacturing technology using microprocessing.

CITATION LIST

Patent Literature

Patent Literature 1: Unexamined Japanese Patent Application Kokai Publication No. H10-256570

SUMMARY OF INVENTION

Technical Problem

The above-mentioned ultrasonic sensor requires an actuator for driving the ultrasonic oscillating element so as to control the direction of emission of ultrasonic waves from the ultrasonic oscillating element. Unfortunately, such an actuator cannot be readily attached to the ultrasonic oscillating element because the ultrasonic oscillating element is composed of a thin film, leading to difficulty in driving the ultrasonic oscillating element composed of a thin film.

An objective of the disclosure, which has been accomplished in view of the above situation, is to provide an ultrasonic sensor that can achieve ready driving of the ultrasonic oscillating element composed of a thin film.

Solution to Problem

In order to achieve the above objective, an ultrasonic sensor according to one aspect of the disclosure includes: a fixed frame fixed to an external member; an ultrasonic oscillator disposed inside the fixed frame, the ultrasonic oscillator including a flexible first substrate and a first piezoelectric element deposited on the first substrate in a form of a thin film, the ultrasonic oscillator being configured to be warped in response to expansion or contraction of the first piezoelectric element and generate ultrasonic waves; and actuator units including a flexible second substrate coupling the first substrate to the fixed frame and a second piezoelectric element deposited on the second substrate in a form of a thin film, the actuator units being configured to be warped in response to expansion or contraction of the second piezoelectric element and cause the ultrasonic oscillator to swing relative to the fixed frame. The fixed frame, the first substrate, and the second substrate are composed of the same substrate.

In this configuration, the fixed frame, the ultrasonic oscillator, and the actuator units may be arranged in the same plane.

The actuator units may cause the ultrasonic oscillator to swing in one direction.

The actuator units may include a pair of linear members disposed on both sides of the ultrasonic oscillator in a first direction. Each of the members may include a section in which the second substrate extends from the inner edge of the fixed frame in a second direction intersecting the first direction, the section being provided with the second piezoelectric element in the form of a thin film, the second piezoelectric element expanding or contracting in the second direction. The members may be configured to be deformed in response to expansion or contraction of the second piezoelectric element and cause the ultrasonic oscillator to swing.

The section of each of the members extending in the second direction may have a length larger than a distance in the second direction from a joint between a corresponding one of the actuator units and the inner edge of the fixed frame to a midpoint of the outer edge of the ultrasonic oscillator.

The ultrasonic oscillator may have a disk shape. The actuator units may include a pair of members extending in a direction along the outer edge of the ultrasonic oscillator in an arc shape, the members being disposed on both sides of the ultrasonic oscillator in a first direction. In each of the members, the second substrate may extend from an inner edge of the fixed frame in the direction along the outer edge of the ultrasonic oscillator in an arc shape, the second piezoelectric element expanding or contracting in the direction in which the second substrate extends. The members may be configured to be deformed in response to expansion or contraction of the second piezoelectric element and cause the ultrasonic oscillator to swing.

The pair of members may be arranged in rotational symmetry of order two about the ultrasonic oscillator.

One of the pair of members may be bonded to the fixed frame at a first position located on one side of a center of the ultrasonic oscillator in a second direction orthogonal to the first direction and may be bonded to the ultrasonic oscillator at a second position located on another side of the center of the ultrasonic oscillator opposite to the first position. Another of the pair of members may be bonded to the fixed frame at a third position located on one side of the center of the ultrasonic oscillator in the second direction and may be bonded to the ultrasonic oscillator at a fourth position located on another side of the center of the ultrasonic oscillator opposite to the third position.

The one and the other of the pair of members may be arranged to face each other at both ends in an extending direction, and the facing outer edges may intersect a straight line extending through the center of the ultrasonic oscillator in the second direction.

The actuator units may cause the ultrasonic oscillator to swing in two directions.

The actuator units may include: a movable frame including a part of the second substrate; first actuators coupling the fixed frame to the movable frame, the first actuators being configured to cause the movable frame to swing relative to the fixed frame about a first rotational axis; and second actuators coupling the movable frame to the ultrasonic oscillator, the second actuators being configured to cause the ultrasonic oscillator to swing relative to the movable frame about a second rotational axis different from the first rotational axis.

The first actuators may include a pair of linear members disposed on both sides of the movable frame in a first direction. Each of the members of the first actuators may include a section in which the second substrate extends from an inner edge of the fixed frame in a second direction intersecting the first direction, the section being provided with the second piezoelectric element in a form of a thin film, the second piezoelectric element expanding or contracting in the second direction. The second substrate of the members of the first actuators may be configured to be deformed in response to expansion or contraction of the second piezoelectric element and cause the movable frame to swing about the first rotational axis. The second actuators may include a pair of linear members disposed on both sides of the ultrasonic oscillator in the second direction. Each of the members of the second actuators may include a section in which the second substrate extends from an inner edge of the movable frame in the first direction, the section being provided with the second piezoelectric element in a form of a thin film, the second piezoelectric element expanding or contracting in the first direction. The members of the second actuators may be configured to be deformed in response to expansion or contraction of the second piezoelectric element and cause the ultrasonic oscillator to swing about the second rotational axis.

The section of each of the first actuators extending in the second direction may have a length larger than a distance in the second direction from a joint between the first actuator and the inner edge of the fixed frame to a midpoint of an outer edge of the movable frame.

The section of each of the second actuators extending in the first direction may have a length larger than a distance in the first direction from a joint between the second actuator and the inner edge of the movable frame to the midpoint of an outer edge of the ultrasonic oscillator.

The ultrasonic oscillator may have a disk shape. The movable frame may have an annular shape and may be arranged concentrically with the ultrasonic oscillator. The first actuators may include a pair of members extending in a direction along an outer edge of the movable frame in an arc shape, the members being disposed on both sides of the ultrasonic oscillator in a first direction. In each of the members of the first actuators, the second substrate may extend from an inner edge of the fixed frame in the direction along the outer edge of the movable frame in an arc shape, the second piezoelectric element expanding or contracting in the direction in which the second substrate extends. The members of the first actuators may be configured to be deformed in response to expansion or contraction of the second piezoelectric element and cause the movable frame to swing about the first rotational axis. The second actuators may include a pair of members extending in a direction along an outer edge of the ultrasonic oscillator in an arc shape, the members being disposed on both sides of the ultrasonic oscillator in a second direction orthogonal to the first direction. In each of the members of the second actuators, the second substrate may extend from an inner edge of the movable frame in the direction along the outer edge of the ultrasonic oscillator in an arc shape, the second piezoelectric element expanding or contracting in the direction in which the second substrate extends. The members of the second actuators may be configured to be deformed in response to expansion or contraction of the second piezoelectric element and cause the ultrasonic oscillator to swing about the second rotational axis.

The pair of members of the first actuators may be arranged in rotational symmetry of order two about the ultrasonic oscillator, and the pair of members of the second actuators may be arranged in rotational symmetry of order two about the ultrasonic oscillator.

One of the pair of members of the first actuators may be bonded to the fixed frame at a first position located on one side of the center of the ultrasonic oscillator in the second direction and may be bonded to the movable frame at a second position located on another side of the center of the ultrasonic oscillator opposite to the first position. Another of the pair of members of the first actuators may be bonded to the fixed frame at a third position located on one side of the center of the ultrasonic oscillator in the second direction and may be bonded to the movable frame at a fourth position located on another side of the center of the ultrasonic oscillator opposite to the third position. One of the pair of members of the second actuators may be bonded to the movable frame at a fifth position located on one side of the center of the ultrasonic oscillator in the first direction and may be bonded to the ultrasonic oscillator at a sixth position located on another side of the center of the ultrasonic oscillator opposite to the fifth position. Another of the pair of members of the second actuators may be bonded to the movable frame at a seventh position located on one side of the center of the ultrasonic oscillator in the first direction and may be bonded to the ultrasonic oscillator at an eighth position located on another side of the center of the ultrasonic oscillator opposite to the seventh position.

The one and the other of the pair of members of the first actuators may be arranged to face each other at both ends in an extending direction, and facing outer edges may intersect a straight line extending through the center of the ultrasonic oscillator in the second direction.

The one and the other of the pair of members of the second actuators may be arranged to face each other at both ends in an extending direction, and facing outer edges may intersect a straight line extending through the center of the ultrasonic oscillator in the first direction.

Advantageous Effects of Invention

According to the disclosure, the fixed frame, the first substrate constituting the ultrasonic oscillator, and the second substrate constituting the actuator units that cause the ultrasonic oscillator to swing are composed of the same substrate. This configuration can achieve ready driving of the ultrasonic oscillating element composed of a thin film.

DESCRIPTION OF EMBODIMENTS

Embodiment 1

First, Embodiment 1 of the disclosure will now be described in detail with reference to the accompanying drawings.

Figure 1:
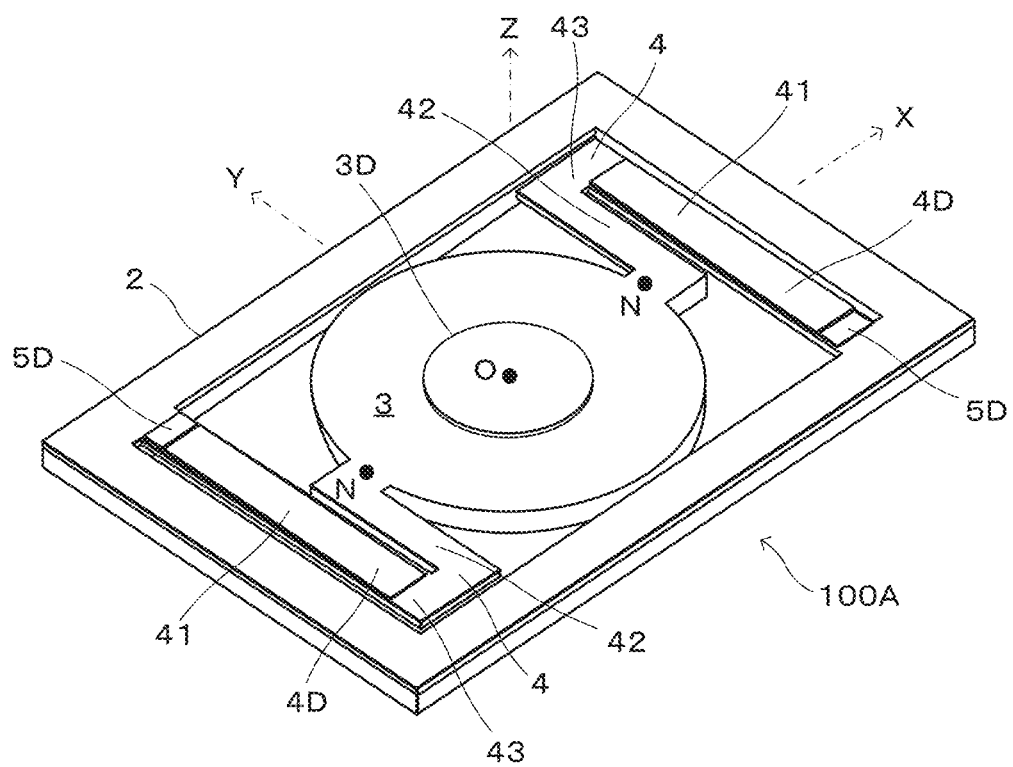
FIG. 1 is a perspective view of an ultrasonic sensor according to Embodiment 1 of the disclosure as viewed from the front.

With reference to FIG. 1, an ultrasonic sensor 100A is formed on a substrate and has a shape of a rectangular plate as a whole. The ultrasonic sensor 100A is fabricated by slitting a semiconductor substrate, which is an example of the substrate, to define a fixed frame 2, an ultrasonic oscillator 3, and actuator units 4. That is, the fixed frame 2, the ultrasonic oscillator 3, and the actuator units 4 are formed on the same substrate. Alternatively, the substrate may also be a stainless-steel plate, for example.

The fixed frame 2 is an outermost frame having a shape of a rectangular plate. The fixed frame 2 is fixed to a base, which is an external member and is not illustrated. The ultrasonic oscillator 3 has a disk shape and is disposed inside the fixed frame 2. The actuator units 4 are a pair of protruding members disposed inside the fixed frame 2.

The following description assumes a three-dimensional XYZ orthogonal coordinate system having the origin O at the gravitational center of the ultrasonic oscillator 3. In this XYZ coordinate system, as illustrated in FIG. 1, the direction of arrangement of the actuator units 4 relative to the ultrasonic oscillator 3 is defined as the X-axis direction, the direction orthogonal to the X axis in the plane of the ultrasonic sensor 100A is defined as the Y-axis direction, and the direction of the normal to the plane of the ultrasonic sensor 100A is defined as the Z-axis direction. According to the embodiment, a first direction is parallel to the X axis and a second direction is parallel to the Y axis.

The ultrasonic oscillator 3 generates ultrasonic waves traveling in the +Z direction. The actuator units 4 are a pair of linear members arranged on both sides of the ultrasonic oscillator 3 in the X-axis direction. The actuator units 4 couple the fixed frame 2 to the ultrasonic oscillator 3 and retain the ultrasonic oscillator 3.

Figure 2:
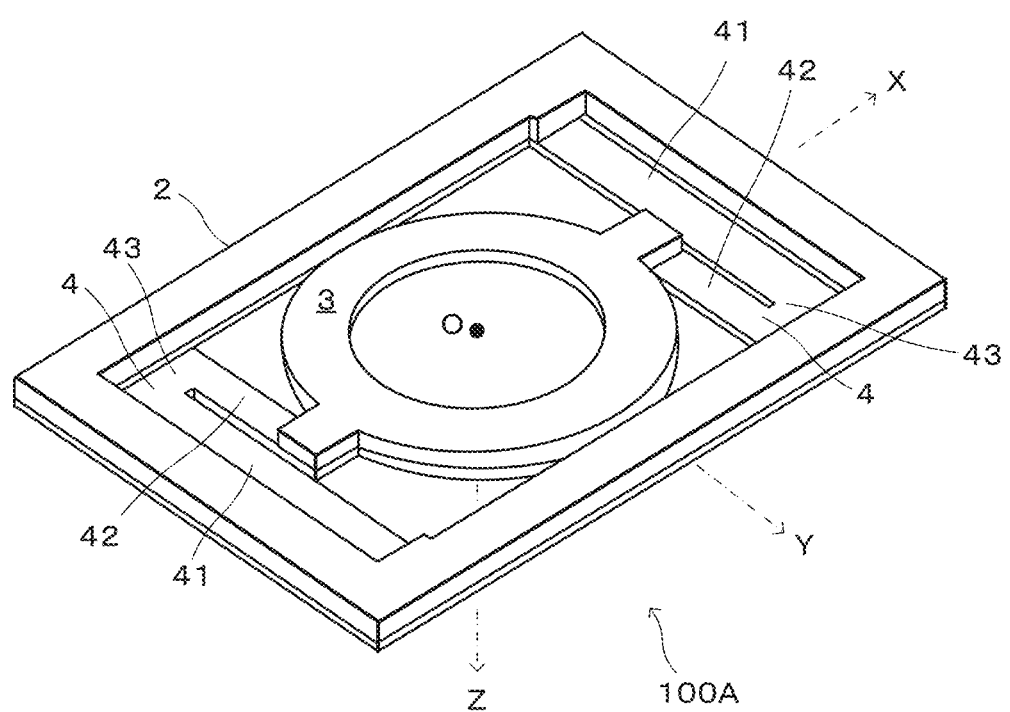
FIG. 2 is a perspective view of the ultrasonic sensor illustrated in FIG. 1 as viewed from the rear.

With reference to FIG. 2, the actuator units 4 have a thickness smaller than the thickness of the fixed frame 2. The actuator units 4 have flexibility at least in the up-down direction (Z-axis direction). The actuator units 4 can thus be warped upward or downward, thereby causing the ultrasonic oscillator 3 to swing relative to the fixed frame 2 within a predetermined range.

Figure 3:
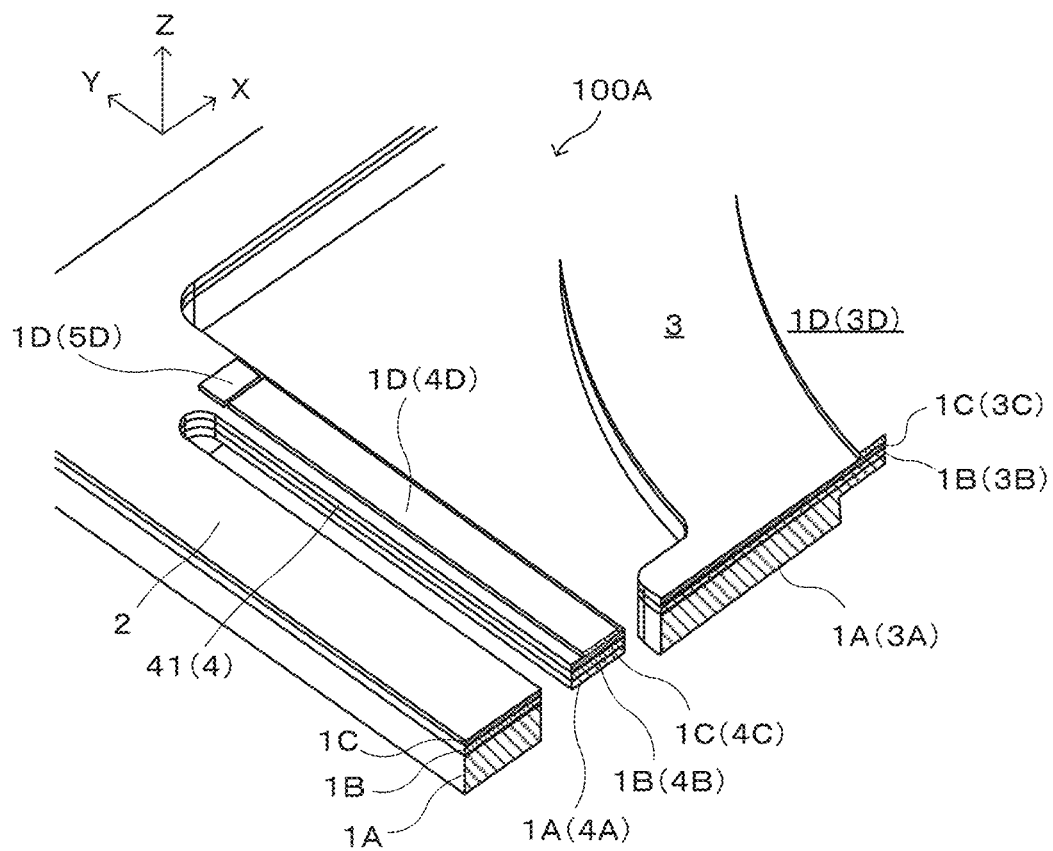
FIG. 3 is a schematic diagram of a laminated structure in a part of the ultrasonic sensor illustrated in FIG. 1.

With reference to FIG. 3, the ultrasonic sensor 100A has a laminated structure including an A-layer 1A, a B-layer 1B, and a C-layer 1C stacked in the order mentioned. The fixed frame 2, the ultrasonic oscillator 3, and the actuator units 4 have a three-layer structure including the A-layer 1A, the B-layer 1B, and the C-layer 1C.

The ultrasonic oscillator 3 and the actuator units 4 further include a D-layer 1D on the C-layer 1C. These four layers (the A-layer 1A, the B-layer 1B, the C-layer 1C, and the D-layer 1D) have a planar shape (shape illustrated in FIG. 1).

The A-layer 1A is a substrate layer functioning as a support substrate for the other layers. The A-layer 1A is composed of a material capable of supporting the B-layer 1B, the C-layer 1C, and the D-layer 1D stacked on the upper surface of the A-layer 1A. It should be noted that the actuator units 4 are required to have flexibility at least in the up-down direction (Z-axis direction). That is, the A-layer 1A (substrate layer) is composed of a material having flexibility to some extent such that the actuator units 4 can be warped within a necessary range (range necessary for inclining the ultrasonic oscillator 3 at a required angle).

According to the embodiment, the A-layer 1A is composed of a silicon substrate. More specifically, the A-layer 1A has a three-layer structure including a support sublayer composed of silicone, a BOX sublayer (silicon dioxide insulating film) composed of silicon dioxide and stacked on the support sublayer, and an active sublayer composed of silicon and stacked on the BOX sublayer.

According to the embodiment, the A-layer 1A has different segments: a segment corresponding to the fixed frame 2; a first substrate 3A included in the ultrasonic oscillator 3; and a second substrate 4A included in the actuator units 4.

The B-layer 1B constitutes the lower electrode layer of a piezoelectric element. The D-layer 1D constitutes the upper electrode layer of the piezoelectric element. Both layers are therefore composed of an electrically conductive material.

The C-layer 1C constitutes the piezoelectric element. The C-layer 1C is composed of a piezoelectric material having piezoelectric effects. For example, the C-layer 1C includes a thin film containing lead zirconate titanate (PZT) or sodium-potassium niobite (KNN). According to the embodiment, the sandwich structure composed of the piezoelectric material layer (C-layer 1C) held between the electrically-conductive material layers (B-layer 1B and D-layer 1D) serves as a piezoelectric element. The C-layer 1C expands or contracts in the longitudinal direction (direction orthogonal to the thickness direction) in response to application of voltage having a certain polarity in the thickness direction.

In practice, the D-layer 1D has different segments: an upper electrode layer 3D included in the ultrasonic oscillator 3; an upper electrode layer 4D included in the actuator units 4; and detection electrodes 5D. The D-layer 1D also includes wiring (not shown) formed on the C-layer 1C.

According to the embodiment, each of the B-layer 1B and the C-layer 1C has a segment corresponding to the fixed frame 2, a segment corresponding to the ultrasonic oscillator 3, and segments corresponding to the actuator units 4. In the ultrasonic oscillator 3, the B-layer 1B serves as a lower electrode layer 3B, the C-layer 1C serves as a piezoelectric material layer 3C, and the D-layer 1D serves as the upper electrode layer 3D. The lower electrode layer 3B, the piezoelectric material layer 3C, and the upper electrode layer 3D constitute a first piezoelectric element (3B, 3C, 3D). In the actuator units 4, the B-layer 1B serves as a lower electrode layer 4B, the C-layer 1C serves as a piezoelectric material layer 4C, and the D-layer 1D serves as the upper electrode layer 4D or the detection electrodes 5D. The lower electrode layer 4B, the piezoelectric material layer 4C, and the upper electrode layer 4D constitute a second piezoelectric element (4B, 4C, 4D).

The ultrasonic sensor 100A has a structure suitable for mass production. In particular, the ultrasonic sensor 100A can be fabricated by a method for producing MEMS elements using a semiconductor manufacturing process. The ultrasonic sensor 100A is formed by sequentially depositing a platinum layer (the B-layer 1B: the lower electrode layer), a PZT layer (the C-layer 1C: the piezoelectric material layer), and a platinum/gold layer (the D-layer 1D: a layer having a two-layer structure including a lower platinum sublayer and an upper gold sublayer) on the upper surface of a silicon substrate (the A-layer 1A: the substrate layer).

After fabrication of the four-layer laminated structure, the D-layer 1D is subject to a patterning process to maintain only the D-layer 1D. Then, the three-layer structure composed of the A-layer 1A, the B-layer 1B, and the C-layer 1C is provided with slits extending in the up-down direction by an etching process, for example. The actuator units 4 and the ultrasonic oscillator 3 are then subject to an etching process, for example, to remove some parts on their lower surfaces, thereby completing the ultrasonic sensor 100A.

In other words, the ultrasonic oscillator 3 of the ultrasonic sensor 100A includes the first substrate 3A (A-layer 1A) and the first piezoelectric element (3B, 3C, 3D) deposited on the first substrate 3A in the form of a thin film. The first substrate 3A has an inner periphery part provided with the first piezoelectric element (3B, 3C, 3D). The inner periphery part is thinner than an outer periphery part and has flexibility. The inner periphery part of the ultrasonic oscillator 3 is warped in response to expansion or contraction of the first piezoelectric element (3B, 3C, 3D) and generates ultrasonic waves.

Each of the actuator units 4 includes the second substrate 4A and the second piezoelectric element (4B, 4C, 4D) deposited on the second substrate 4A in the form of a thin film. The second substrate 4A couples the first substrate 3A to the fixed frame 2 (A-layer 1A). The actuator units 4 are warped in response to expansion or contraction of the second piezoelectric element (4B, 4C, 4D) and cause the ultrasonic oscillator 3 to swing relative to the fixed frame 2.

As described above, the fixed frame 2, the first substrate 3A, and the second substrate 4A are composed of the same semiconductor substrate. In addition, the fixed frame 2, the ultrasonic oscillator 3, and the actuator units 4 are arranged in the same plane.

In more detail, as illustrated in FIGS. 1 and 2, each of the actuator units 4 has three sections: a distal arm section 41; a proximal arm section 42; and a middle arm section 43.

The distal arm section 41 extends from the inner edge of the fixed frame 2 in the Y-axis direction (second direction). The distal arm section 41 linearly extends across the midpoint N of the outer edge of the ultrasonic oscillator 3. The distal arm section 41 is provided with the second piezoelectric element (4B, 4C, 4D) in the form of a thin film. The actuator units 4 are deformed in response to expansion or contraction of the second piezoelectric element (4B, 4C, 4D) and cause the ultrasonic oscillator 3 to swing.

The proximal arm section 42 has an end bonded to the midpoint N of the outer edge of the ultrasonic oscillator 3 and extends in parallel to the distal arm section 41. The middle arm section 43 extends in the X-axis direction and couples the end of the distal arm section 41 to the other end of the proximal arm section 42. Each of the actuator units 4 has a length in the Y-axis direction larger than the distance in the Y-axis direction from the joint between the actuator unit 4 and the inner edge of the fixed frame 2 to the midpoint N of the outer edge of the ultrasonic oscillator 3.

The pair of members of the actuator units 4 are arranged in rotational symmetry of order two about the origin O.

According to the embodiment, the actuator units 4 cause the ultrasonic oscillator 3 to swing in one direction (about the X axis). That is, the actuator units 4, which are arranged on both sides of the ultrasonic oscillator 3 in the X-axis direction, are deformed in response to expansion or contraction of the piezoelectric element and cause the ultrasonic oscillator 3 to swing relative to the fixed frame 2 about the rotational axis extending in the X-axis direction.

Operations of the ultrasonic sensor 100A will now be explained.

Figure 4A:
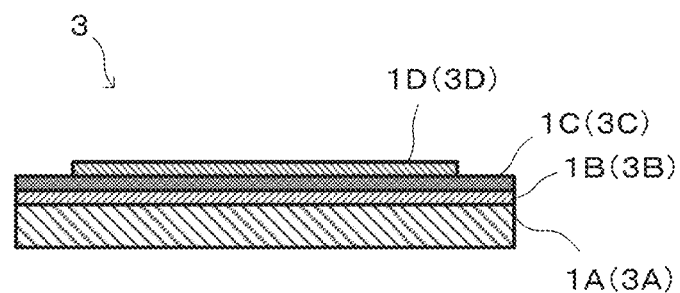
FIG. 4A illustrates a first movement of the ultrasonic oscillator.
Figure 4B:
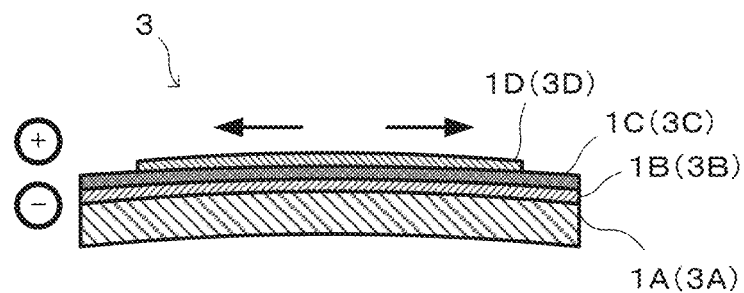
FIG. 4B illustrates a second movement of the ultrasonic oscillator.
Figure 4C:
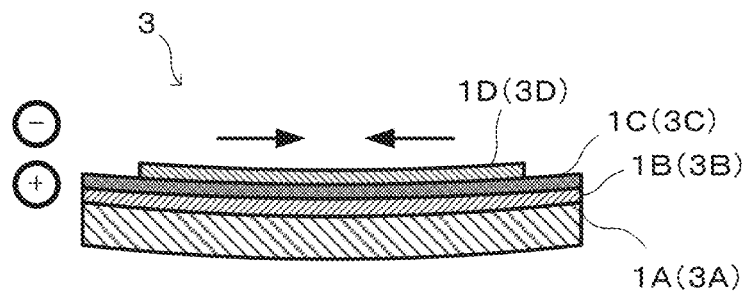
FIG. 4C illustrates a third movement of the ultrasonic oscillator.

FIGS. 4A, 4B, and 4C are sectional views illustrating movements of the ultrasonic oscillator 3. As illustrated in FIG. 4A, when no voltage is applied to the first piezoelectric element (3B, 3C, 3D), the first piezoelectric element (3B, 3C, 3D) does not expand or contract, so that the first substrate 3A is retained horizontally.

When voltage is applied between the electrodes such that the upper electrode layer 3D is positive and the lower electrode layer 3B is negative, the piezoelectric material layer 3C expands in the longitudinal direction (direction orthogonal to the thickness direction). In contrast, when voltage is applied between the electrodes such that the upper electrode layer 3D is negative and the lower electrode layer 3B is positive, the piezoelectric material layer 3C contracts in the longitudinal direction. The level of expansion or contraction depends on the value of the applied voltage.

Accordingly, with reference to FIG. 4B, when applying voltage having a polarity (hereinafter referred to as "positive polarity") such that the upper electrode layer 3D is positive and the lower electrode layer 3B is negative, the first piezoelectric element (3B, 3C, 3D) expands in the longitudinal direction, resulting in a stress in the direction of expansion in the plane on the upper surface of the flexible first substrate 3A. The ultrasonic oscillator 3 is thus warped to be convex upward.

In contrast, with reference to FIG. 4C, when applying voltage having a polarity (hereinafter referred to as "negative polarity") such that the upper electrode layer 3D is negative and the lower electrode layer 3B is positive, the first piezoelectric element (3B, 3C, 3D) contracts in the longitudinal direction, resulting in a stress in the direction of contraction in the plane on the upper surface of the flexible first substrate 3A. The ultrasonic oscillator 3 is thus warped to be convex downward.

The first piezoelectric element (3B, 3C, 3D) is thus driven to repeat shifting between the mode illustrated in FIG. 4B and the mode illustrated in FIG. 4C, for example, at a frequency of 20 kHz or higher. This process causes the ultrasonic oscillator 3 to oscillate and generate ultrasonic waves.

Alternatively, the piezoelectric material layer 3C may contract in the longitudinal direction when applying voltage between the electrodes such that the upper electrode layer 3D is positive and the lower electrode layer 3B is negative, and may expand in the longitudinal direction when applying voltage between the electrodes such that the upper electrode layer 3D is negative and the lower electrode layer 3B is positive. In this case, the ultrasonic oscillator is warped to be convex downward in response to application of voltage having the positive polarity and is warped to be convex upward in response to application of voltage having the negative polarity.

In either case, application of voltage having a certain polarity between the upper electrode layer 3D and the lower electrode layer 3B can cause deformation illustrated in FIG. 4B or 4C. It should be noted that the above-described relationship between the voltage polarity and the expansion or contraction may be reversed because the polarizing action depends on the material (for example, a bulk or thin film) of the piezoelectric element.

Movements of each of the actuator units 4 will now be explained.

Figure 5A:
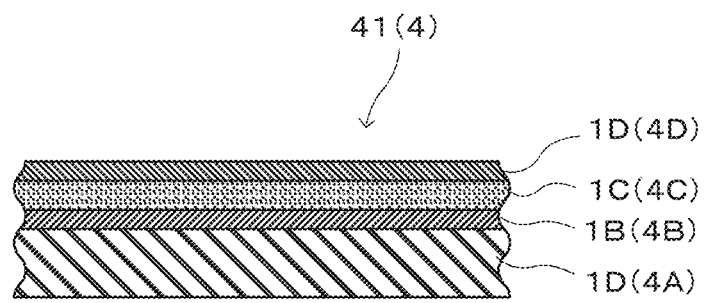
FIG. 5A illustrates a first movement of a piezoelectric element.
Figure 5B:
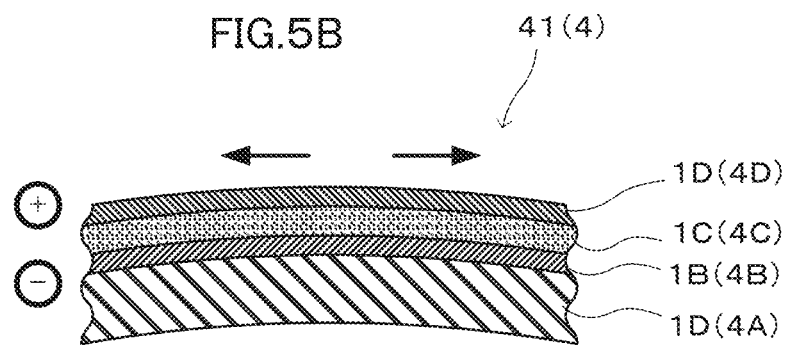
FIG. 5B illustrates a second movement of the piezoelectric element.
Figure 5C:
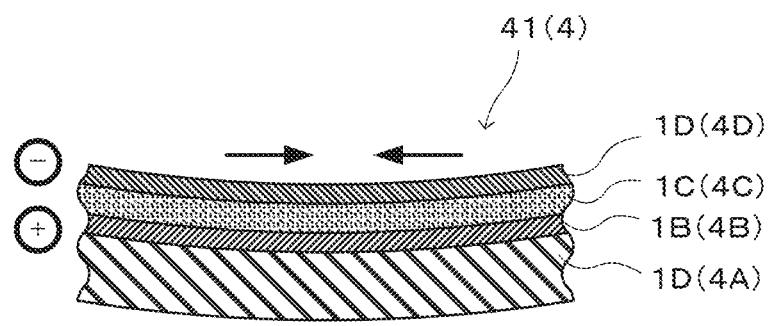
FIG. 5C illustrates a third movement of the piezoelectric element.

FIGS. 5A, 5B, and 5C are sectional views illustrating movements of each of the actuator units 4. As illustrated in FIG. 5A, when no voltage is applied to the second piezoelectric element (4B, 4C, 4D), the second piezoelectric element (4B, 4C, 4D) does not expand or contract, so that the distal arm section 41 of the actuator unit 4 is retained horizontally.

When voltage is applied between the electrodes such that the upper electrode layer 4D is positive and the lower electrode layer 4B is negative, the piezoelectric material layer 4C expands in the longitudinal direction (direction orthogonal to the thickness direction). In contrast, when voltage is applied between the electrodes such that the upper electrode layer 4D is negative and the lower electrode layer 4B is positive, the piezoelectric material layer 4C contracts in the longitudinal direction. The level of expansion or contraction depends on the value of the applied voltage.

Accordingly, with reference to FIG. 5B, when applying voltage having a polarity (hereinafter referred to as "positive polarity") such that the upper electrode layer 4D is positive and the lower electrode layer 4B is negative, the second piezoelectric element (4B, 4C, 4D) expands in the longitudinal direction, resulting in a stress in the direction of expansion in the plane (in the direction along the Y axis) on the upper surface of the flexible second substrate 4A. The distal arm section 41 of the actuator unit 4 is thus warped to be convex upward.

In contrast, with reference to FIG. 5C, when applying voltage having a polarity (hereinafter referred to as "negative polarity") such that the upper electrode layer 4D is negative and the lower electrode layer 4B is positive, the second piezoelectric element (4B, 4C, 4D) contracts in the longitudinal direction, resulting in a stress in the direction of contraction in the plane on the upper surface of the flexible second substrate 4A. The distal arm section 41 of the actuator unit 4 is thus warped to be convex downward.

The same explanation as in the ultrasonic oscillator 3 holds true for the relationship between the voltage applied between the electrodes and the direction of expansion or contraction, for example.

Referring back to FIG. 1, the detection electrodes 5D are provided to detect displacement of the actuator units 4. The detection electrodes 5D have a width smaller than the width of the actuator units 4 for accommodation of wiring.

The detection electrodes 5D are installed at the joints between the actuator units 4 and the fixed frame 2. The detection electrodes 5D disposed at the joints can stably detect displacement of the actuator units 4 because the actuator units 4 show large deformation at the joints.

The ultrasonic oscillator 3 is coupled to the fixed frame 2 by each of the actuator units 4. The ultrasonic oscillator 3 is retained by the actuator unit 4 while being suspended above the base. This suspended ultrasonic oscillator 3 is therefore inclined about the X axis, that is, toward the Y-axis direction when the actuator unit 4 is warped upward or downward.

Figure 6A:
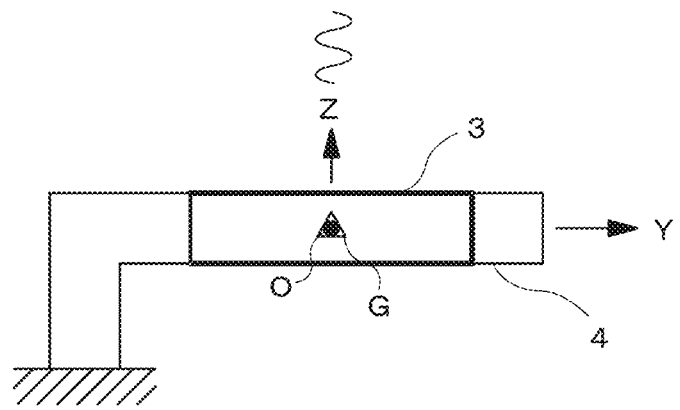
FIG. 6A is a sectional view illustrating a first movement of an actuator unit.

With reference to FIG. 6A, when no voltage is applied to the second piezoelectric element (4B, 4C, 4D) of the actuator unit 4, the ultrasonic oscillator 3 is retained horizontally by the actuator unit 4 above the base (fixed point). The white triangle in the figure indicates the gravitational center G of the ultrasonic oscillator 3. The gravitational center G accords with the origin O of the coordinate system. The ultrasonic oscillator 3 in this orientation emits ultrasonic waves in the +Z direction.

Figure 6B:
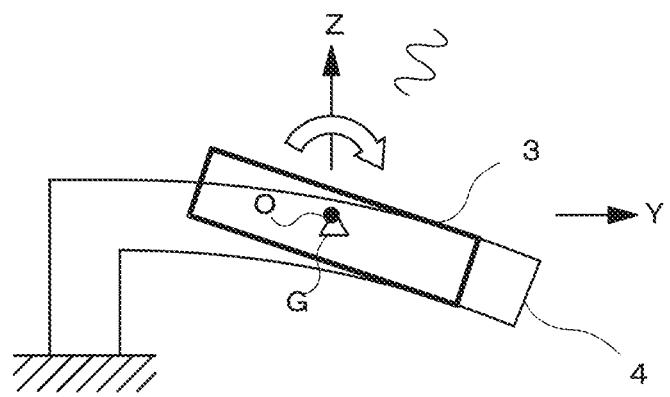
FIG. 6B is a sectional view illustrating a second movement of the actuator unit.

When the distal arm section 41 of the actuator unit 4 is warped to be convex upward, the entire actuator unit 4 is inclined with the +Y end down. This movement can cause the ultrasonic oscillator 3 to be inclined such that the +Y end is located at the lowest position, as illustrated in FIG. 6B. The ultrasonic oscillator 3 in this orientation emits ultrasonic waves in the direction inclined from the +Z direction to the +Y direction.

Figure 6C:
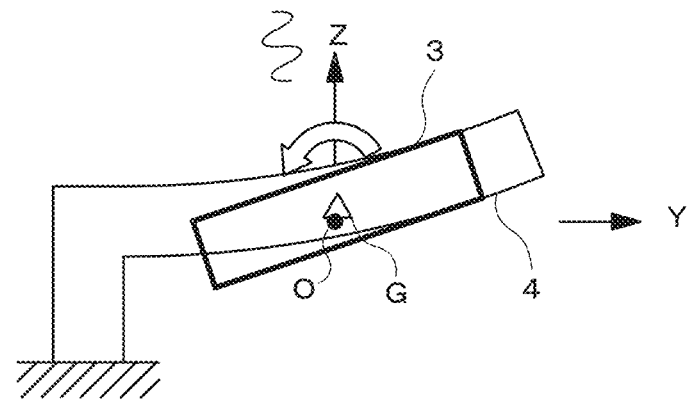
FIG. 6C is a sectional view illustrating a third movement of the actuator unit.

When the distal arm section 41 of the actuator unit 4 is warped to be convex downward, the entire actuator unit 4 is inclined with the −Y end down. This movement can cause the ultrasonic oscillator 3 to be inclined such that the −Y end is located at the lowest position, as illustrated in FIG. 6C. The ultrasonic oscillator 3 in this orientation emits ultrasonic waves in the direction inclined from the +Z direction to the −Y direction.

The voltage having the negative polarity is applied to each of the piezoelectric element of the actuator unit 4 on the +X side and the piezoelectric element of the actuator unit 4 on the −X side. These actuator units 4 can cause the ultrasonic oscillator 3 to swing relative to the fixed frame 2 about the X axis.

The degree of inclination depends on the value of the applied voltage. That is, the inclination angle of the ultrasonic oscillator 3 about the X axis can be arbitrarily adjusted by changing the polarity and value of the applied voltage.

According to the embodiment, the actuator units 4 and the ultrasonic oscillator 3 are disposed inside the fixed frame 2. The actuator units 4 and the ultrasonic oscillator 3 are movable components that cause displacement and should therefore be prevented from coming into contact with an external object. In this respect, the fixed frame 2 has a frame shape encompassing the movable components and can thus prevent the movable components from coming into contact with an external object.

As described in detail above, according to the embodiment, the fixed frame 2, the first substrate 3A included in the ultrasonic oscillator 3, and the second substrate 4A included in the actuator units 4 for causing the ultrasonic oscillator 3 to swing are composed of the same semiconductor substrate. This configuration does not require attachment of the ultrasonic oscillator 3 to an external driver and can thus readily drive the ultrasonic oscillator 3 composed of a thin film.

According to the embodiment, the fixed frame 2, the ultrasonic oscillator 3, and the actuator units 4 are arranged in the same plane. This configuration can reduce the size and thickness of the ultrasonic sensor 100A.

According to the embodiment, the actuator units 4 cause the ultrasonic oscillator 3 to swing in one direction. This configuration can achieve transmission of ultrasonic waves to a wide range.

According to the embodiment, the pair of members of the actuator units 4 have the second piezoelectric element (4B, 4C, 4D) that can expand or contract in the Y-axis direction. The actuator units 4 are deformed in response to expansion or contraction of the second piezoelectric element (4B, 4C, 4D), thereby causing the ultrasonic oscillator 3 to swing. This configuration can significantly reduce the size of the actuator units 4.

According to the embodiment, the length of the distal arm section 41 of each actuator unit 4 provided with the second piezoelectric element (4B, 4C, 4D) is larger than the distance from the inner edge of the fixed frame 2 to the midpoint N of the outer edge of the ultrasonic oscillator 3. This configuration can increase the angle of swing of the ultrasonic oscillator 3.

The fixed frame 2 does not necessarily have a rectangular shape and may have an elliptical or polygonal shape, for example. The ultrasonic oscillator 3 does not necessarily have a circular shape and may have an elliptical or polygonal shape.

Since each of the actuator units 4 is bonded to the midpoint N of the outer edge of the ultrasonic oscillator 3, almost no moment except for those in the X- and Y-axis directions is applied to the ultrasonic oscillator 3. This configuration can prevent oscillation of the ultrasonic oscillator 3 from being unbalanced or twisted in any direction. The configuration can also simplify the configuration of the actuator units 4 and reduce the size of the ultrasonic oscillator 3.

Embodiment 2

Then, Embodiment 2 of the disclosure will now be described.

Figure 7:
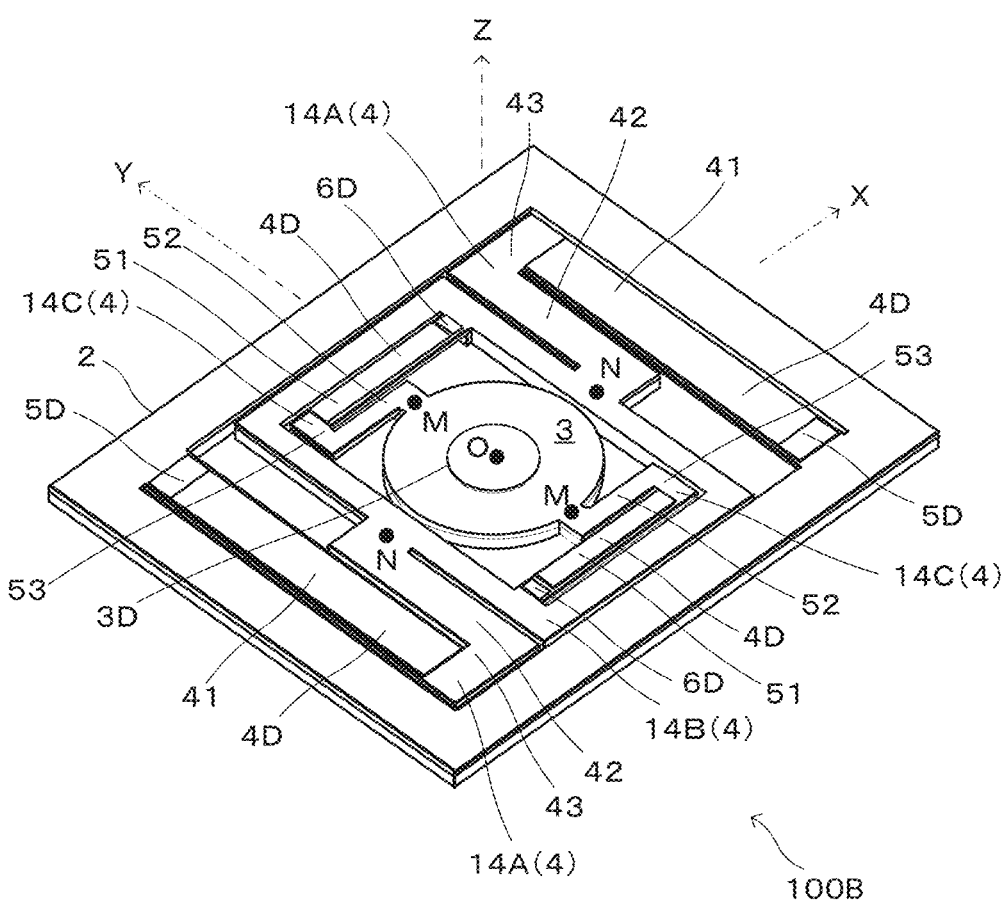
FIG. 7 is a perspective view of an ultrasonic sensor according to Embodiment 2 of the disclosure.
Figure 8:
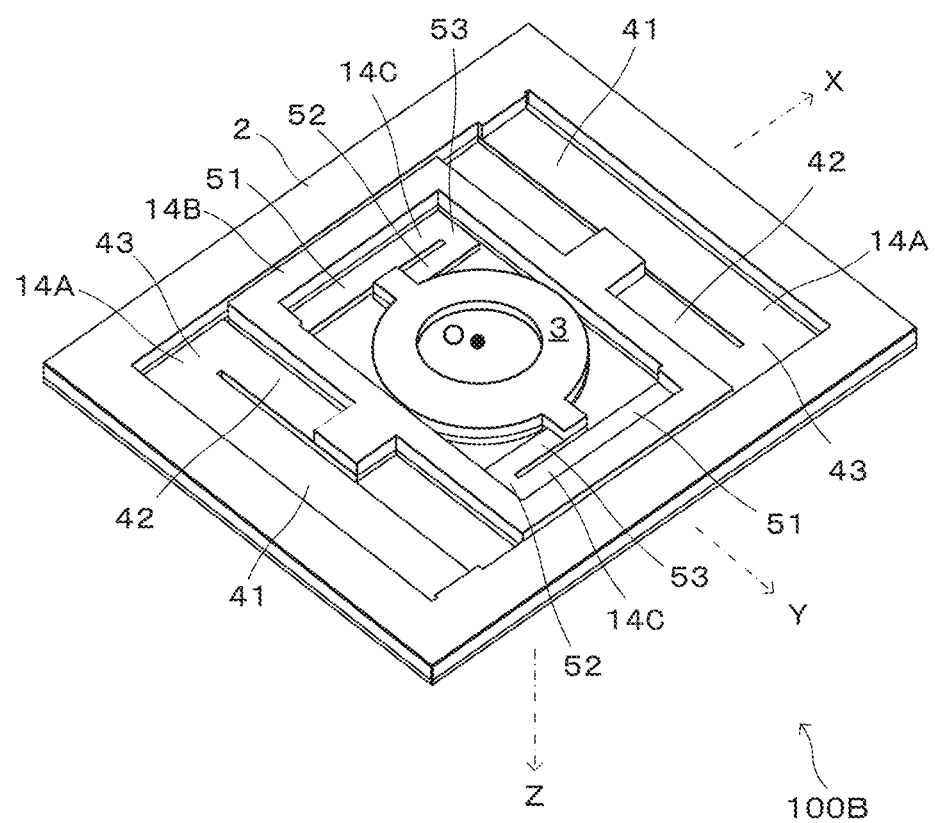
FIG. 8 is a perspective view of the ultrasonic sensor illustrated in FIG. 7 as viewed from the rear.

As illustrated in FIGS. 7 and 8, an ultrasonic sensor 100B according to Embodiment 2 differs from that of Embodiment 1 in the configuration of the actuator units 4. The actuator units 4 cause the ultrasonic oscillator 3 to swing not only about the X axis but also about the Y axis. In the ultrasonic sensor 100B according to the embodiment, the actuator units 4 cause the ultrasonic oscillator 3 to swing in two directions.

According to the embodiment, the actuator units 4 include first actuators 14A, a movable frame 14B, and second actuators 14C.

The first actuators 14A are arranged on both sides of the movable frame 14B in the X-axis direction. Each of the first actuators 14A is disposed between the fixed frame 2 and the movable frame 14B. The first actuators 14A couple the fixed frame 2 to the movable frame 14B and cause the movable frame 14B to swing relative to the fixed frame 2 about the X axis (first rotational axis). The first actuators 14A have a configuration substantially identical to the configuration of the actuator units 4 according to Embodiment 1.

The movable frame 14B is a rectangular frame composed of a part of the second substrate 4A. The movable frame 14B is disposed inside the fixed frame 2 and surrounds the ultrasonic oscillator 3.

The second actuators 14C are arranged on both sides of the ultrasonic oscillator 3 in the Y-axis direction. Each of the second actuators 14C is disposed between the movable frame 14B and the ultrasonic oscillator 3. The second actuators 14C couple the movable frame 14B to the ultrasonic oscillator 3 and cause the ultrasonic oscillator 3 to swing relative to the movable frame 14B about the Y axis (second rotational axis).

Figure 9:
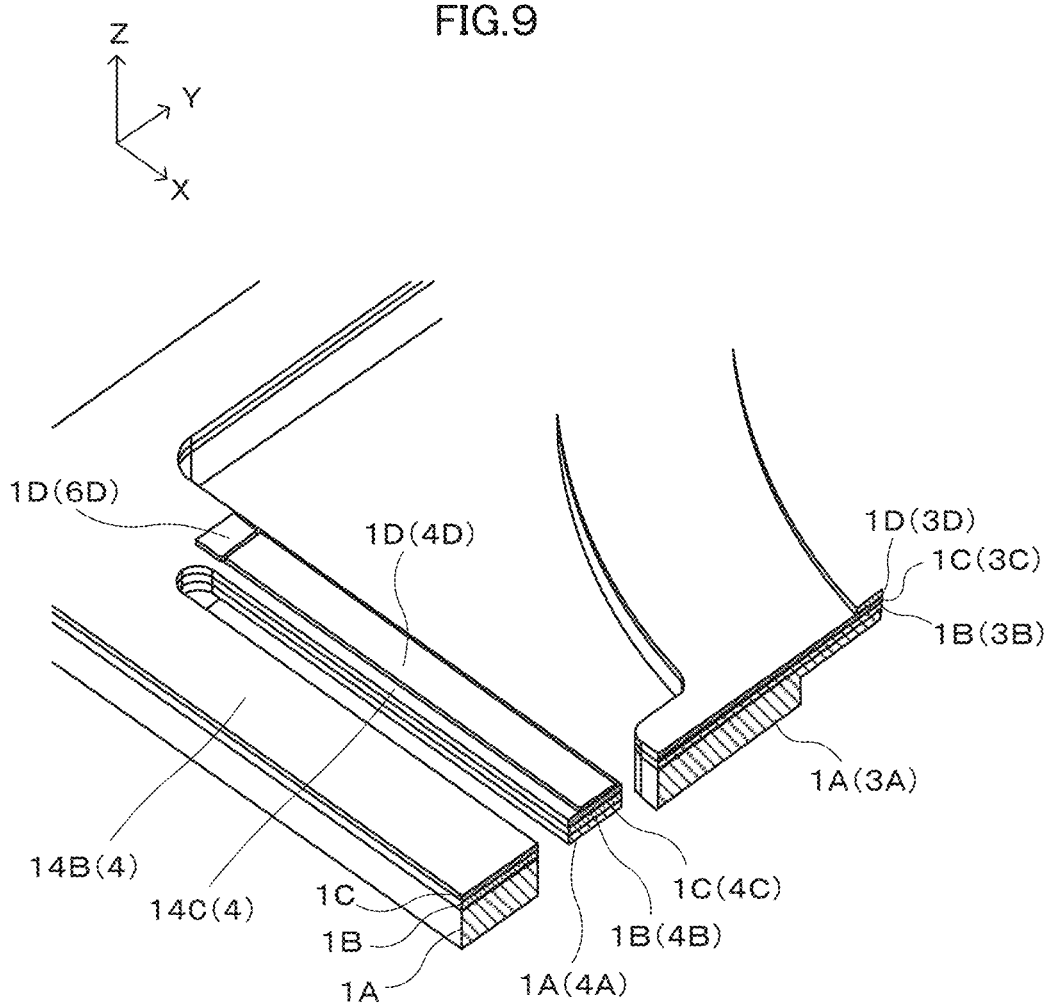
FIG. 9 is a schematic diagram of a laminated structure in a part of the ultrasonic sensor illustrated in FIG. 7.

With reference to FIG. 9, in the ultrasonic sensor 100B according to Embodiment 2, each of the fixed frame 2, the ultrasonic oscillator 3, and the actuator units 4 (the first actuators 14A, the movable frame 14B, and the second actuators 14C) has a three-layer structure including the A-layer 1A, the B-layer 1B, and the C-layer 1C. As illustrated in FIG. 8, the first actuators 14A and the second actuators 14C have a thickness smaller than the thickness of the fixed frame 2 and the movable frame 14B so as to define gaps below the first actuators 14A and the second actuators 14C. These gaps allow for deformation of the first actuators 14A and the second actuators 14C. The thickness of the first actuators 14A and the second actuators 14C can be reduced, for example, by removing part of the support sublayer of the three sublayers (support sublayer, BOX sublayer, and active sublayer) included in the A-layer 1A.

The configuration of each component will now be described in more detail. The first actuators 14A of the actuator units 4 are a pair of linear members arranged on both sides of the movable frame 14B in the X-axis direction. Each member of the first actuators 14A includes a section in which the second substrate 4A extends from the inner edge of the fixed frame 2 in the Y-axis direction. This section of the first actuator 14A is provided with the second piezoelectric element (4B, 4C, 4D) in the form of a thin film. The second piezoelectric element (4B, 4C, 4D) can expand or contract in the Y-axis direction. The second substrate 4A is deformed in response to expansion or contraction of the second piezoelectric element (4B, 4C, 4D) and causes the movable frame 14B to swing about the X axis. The section of the first actuator 14A extending in the Y-axis direction has a length larger than the distance in the Y-axis direction from the joint between the first actuator 14A and the inner edge of the fixed frame 2 to the midpoint N of the outer edge of the movable frame 14B.

Each of the second actuators 14C has three sections: a distal arm section 51; a proximal arm section 52; and a middle arm section 53.

The distal arm section 51 extends from the inner edge of the movable frame 14B in the X-axis direction (first direction). The distal arm section 51 linearly extends across the midpoint M of the outer edge of the ultrasonic oscillator 3. The distal arm section 51 is provided with the second piezoelectric element (4B, 4C, 4D) in the form of a thin film. The actuator units 4 are deformed in response to expansion or contraction of the second piezoelectric element (4B, 4C, 4D) and cause the ultrasonic oscillator 3 to swing.

The proximal arm section 52 has an end bonded to the midpoint M of the outer edge of the ultrasonic oscillator 3 and extends in parallel to the distal arm section 51. The middle arm section 53 extends in the Y-axis direction and couples the end of the distal arm section 51 to the other end of the proximal arm section 52. Each of the actuator units 4 has a length in the X-axis direction larger than the distance in the X-axis direction from the inner edge of the movable frame 14B to the midpoint M of the outer edge of the ultrasonic oscillator 3.

Figure 10A:
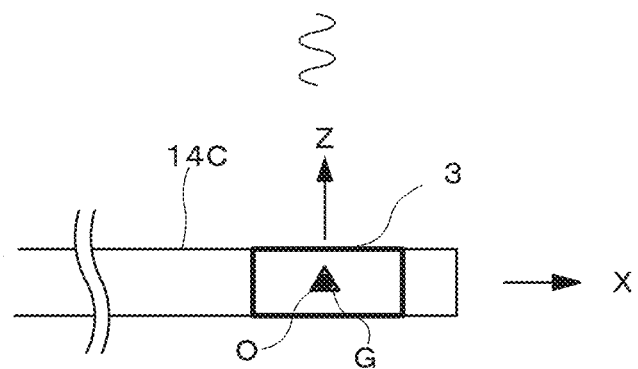
FIG. 10A is a sectional view illustrating a first movement of an actuator unit.

With reference to FIG. 10A, when no voltage is applied to the second piezoelectric element (4B, 4C, 4D) of the second actuator 14C, the ultrasonic oscillator 3 is retained horizontally by the movable frame 14B (refer to FIG. 7) via the second actuator 14C. The white triangle in the figure indicates the gravitational center G of the ultrasonic oscillator 3. The gravitational center G accords with the origin O of the coordinate system. In this case, ultrasonic waves are emitted in the +Z direction.

Figure 10B:
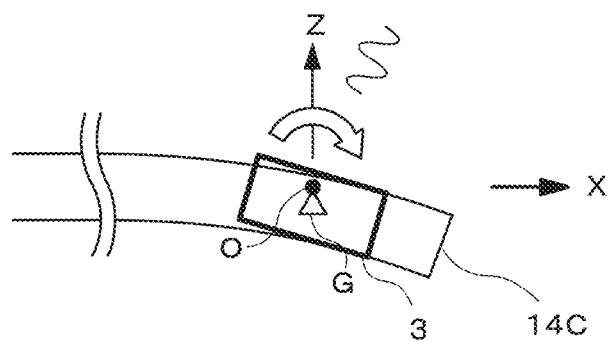
FIG. 10B is a sectional view illustrating a second movement of the actuator unit.

When the distal arm section 51 is warped to be convex upward, the entire second actuator 14C is inclined with the +X end down. This movement can cause the ultrasonic oscillator 3 to be inclined such that the +X end is located at the lowest position, as illustrated in FIG. 10B. In this case, ultrasonic waves are emitted in the direction inclined to the +X direction.

Figure 10C:
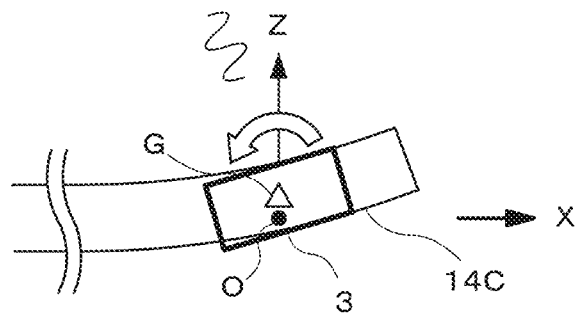
FIG. 10C is a sectional view illustrating a third movement of the actuator unit.

When the distal arm section 51 is warped to be convex downward, the entire second actuator 14C is inclined with the −X end down. This movement can cause the ultrasonic oscillator 3 to be inclined such that the −X end is located at the lowest position, as illustrated in FIG. 10C. In this case, ultrasonic waves are emitted in the direction inclined to the −X direction.

The voltage having the negative polarity is applied to each of the piezoelectric element of the second actuator 14C on the +Y side and the piezoelectric element of the second actuator 14C on the −Y side. These second actuators 14C can cause the ultrasonic oscillator 3 to swing relative to the movable frame 14B about the Y axis.

The degree of inclination depends on the value of the applied voltage. That is, the inclination angle of the ultrasonic oscillator 3 about the Y axis can be arbitrarily adjusted by changing the polarity and value of the applied voltage.

As described above, the ultrasonic sensor 100B has the distal arm sections 51 extending along the X axis, the upper or lower surfaces of which are provided with the second piezoelectric element (4B, 4C, 4D) that can expand or contract in the X-axis direction in response to application of voltage having a certain polarity. If applying voltage to the second piezoelectric element (4B, 4C, 4D) for causing the second piezoelectric element (4B, 4C, 4D) to expand or contract, the ultrasonic oscillator 3 can be inclined to the X-axis direction (turned about the Y axis) at a larger angle. This configuration can ensure a sufficient inclination angle about the Y axis.

The joints between the second actuators 14C and the movable frame 14B are provided with detection electrodes 6D. The detection electrodes 6D disposed at the joints can stably detect displacement of the second actuators 14C because the second actuators 14C show large deformation at the joints.

As described above, according to the embodiment, the actuator units 4 cause the ultrasonic oscillator 3 to swing in two directions. This configuration can achieve transmission of ultrasonic waves to a broader area.

According to the embodiment, the actuator units 4 include the first actuators 14A causing the ultrasonic oscillator 3 to swing about the X axis, the movable frame 14B, and the second actuators 14C causing the ultrasonic oscillator 3 to swing about the Y axis. This configuration can significantly reduce the size of the actuator units 4 that cause the ultrasonic oscillator 3 to swing in two directions.

According to the embodiment, the pair of first actuators 14A and the pair of second actuators 14C have the second piezoelectric element (4B, 4C, 4D) that can expand or contract in the X- or Y-axis direction. The first actuators 14A and the second actuators 14C are deformed in response to expansion or contraction of the second piezoelectric element (4B, 4C, 4D), thereby causing the ultrasonic oscillator 3 to swing. This configuration can significantly reduce the size of the actuator units 4.

According to the embodiment, in each of the first actuators 14A and the second actuators 14C, the distal arm sections 41 and 51 provided with the second piezoelectric element (4B, 4C, 4D) have lengths, respectively, larger than the distance from the inner edge of the fixed frame 2 to the midpoint N of the outer edge of the movable frame 14B and the distance from the inner edge of the movable frame 14B to the midpoint M of the outer edge of the ultrasonic oscillator 3. This configuration can increase the angles of swing of the ultrasonic oscillator 3 in two directions.

According to the embodiment, adjustment of the lengths of the first actuators 14A and the second actuators 14C can provide a desired ratio of drive frequencies between the first actuators 14A and the second actuators 14C. The ultrasonic sensor 100B according to Embodiment 2 can thus achieve optimization of drive frequencies and size reduction.

According to Embodiment 2, the first actuators 14A are arranged in rotational symmetry of order two about the origin O of the ultrasonic oscillator 3. In addition, the second actuators 14C are arranged in rotational symmetry of order two about the ultrasonic oscillator 3. The direction from one end of the distal arm section 41 that is bonded to the fixed frame 2 to the other end accords with the direction from one end of the distal arm section 51 that is bonded to the movable frame 14B to the other end with respect to the rotational direction about the origin O.

Alternatively, the second actuators 14C may extend in a different direction. That is, the direction from one end of the distal arm section 41 that is bonded to the fixed frame 2 to the other end may be opposite to the direction from one end of the distal arm section 51 that is bonded to the movable frame 14B to the other end with respect to the rotational direction about the origin O.

For example, if a two-dimensional ultrasonic scanning operation by the ultrasonic sensor 100B according to Embodiment 2 provides unbalanced traveling directions of ultrasonic waves, such unbalanced traveling directions of ultrasonic waves can be corrected in some cases by using an ultrasonic sensor 100B equipped with the second actuators 14C extending in a different direction. The problem can be solved by using the ultrasonic sensor 100B equipped with the second actuators 14C extending in the opposite direction.

Such distortion of an image in the two-dimensional scanning operation can also be corrected by other various methods. For example, the movable frame 14B may be provided with a weight. This configuration can reduce axis deviation of swing of the movable frame 14B and the ultrasonic oscillator 3, thereby correcting the traveling directions of ultrasonic waves.

Such a weight may also be attached to components other than the movable frame 14B. For example, the ultrasonic oscillator 3 may be provided with a weight. Alternatively, one or both of the first and second actuators 14A and 14C may be provided with weights.

The ultrasonic sensors 100A and 100B according to the above embodiments can be installed in various apparatuses. The ultrasonic sensors 100A and 100B can be installed in apparatuses, such as drones and cleaning robots, to detect obstacles depending on the state of reception of emitted ultrasonic waves.

Figure 11:
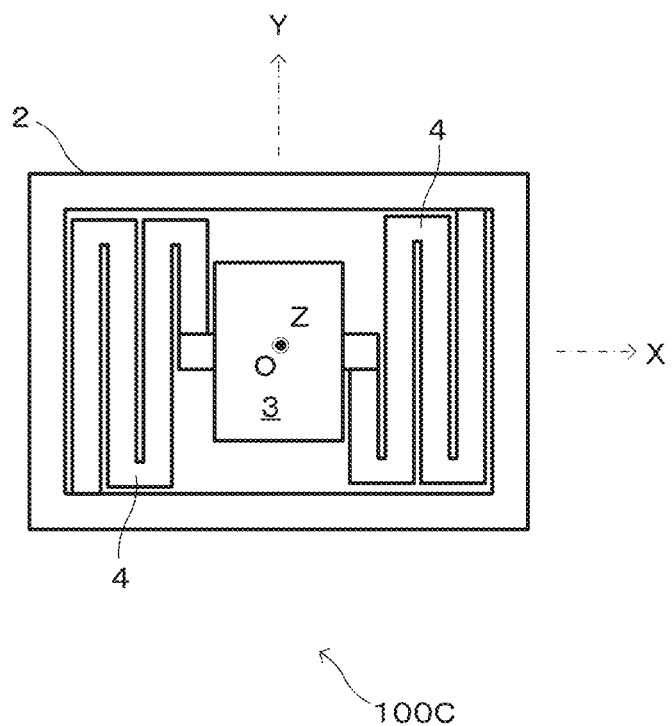
FIG. 11 is a schematic diagram of an ultrasonic sensor according to a first modification.
Figure 12:
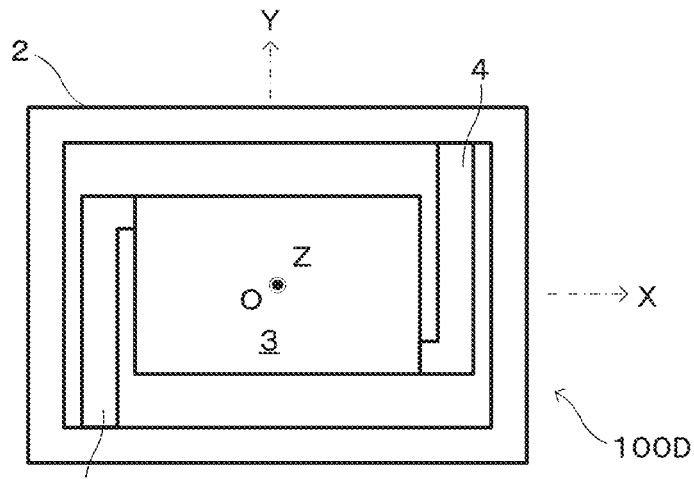
FIG. 12 is a schematic diagram of an ultrasonic sensor according to a second modification.
Figure 13:
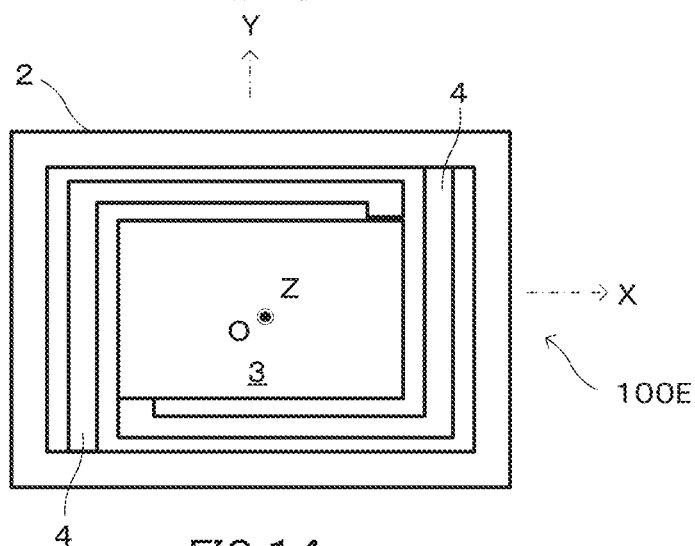
FIG. 13 is a schematic diagram of an ultrasonic sensor according to a third modification.
Figure 14:
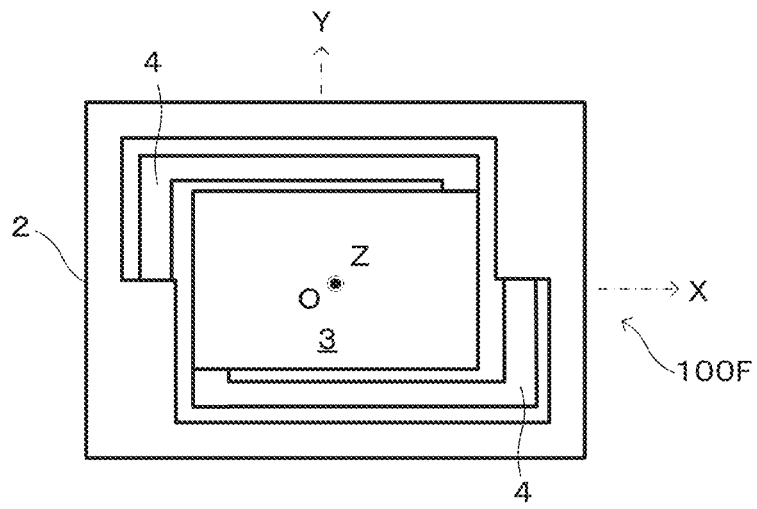
FIG. 14 is a schematic diagram of an ultrasonic sensor according to a fourth modification.

The actuator units 4 may have a shape other than those illustrated in the above embodiments. For example, the actuator units 4 may have a meander shape, as in an ultrasonic sensor 100C illustrated in FIG. 11. Alternatively, each of the actuator units 4 may be bonded to a corner of the ultrasonic oscillator 3, as in an ultrasonic sensor 100D illustrated in FIG. 12. Alternatively, the actuator units 4 may be bent in an L-shape, as in an ultrasonic sensor 100E illustrated in FIG. 13 and an ultrasonic sensor 100F illustrated in FIG. 14.

Although the second piezoelectric element (4B, 4C, 4D) provided to the distal arm sections 41 and 51 expands or contracts according to the embodiment, this configuration should not be construed as limiting the disclosure. The second piezoelectric element (4B, 4C, 4D) provided to the proximal arm sections 42 and 52 may also expand or contract as well as the second piezoelectric element (4B, 4C, 4D) provided to the distal arm sections 41 and 51. In this configuration, the proximal arm sections 42 and 52 include the lower electrode layer 4B, the piezoelectric material layer 4C, and the upper electrode layer 4D.

As described above, a section of the actuator units 4 that includes a piezoelectric element that expands or contracts can be appropriately determined depending on the mode of swing required for the movable frame 14B and the ultrasonic oscillator 3.

Embodiment 3

Then, Embodiment 3 of the disclosure will now be described in detail with reference to the accompanying drawings.

Figure 15:
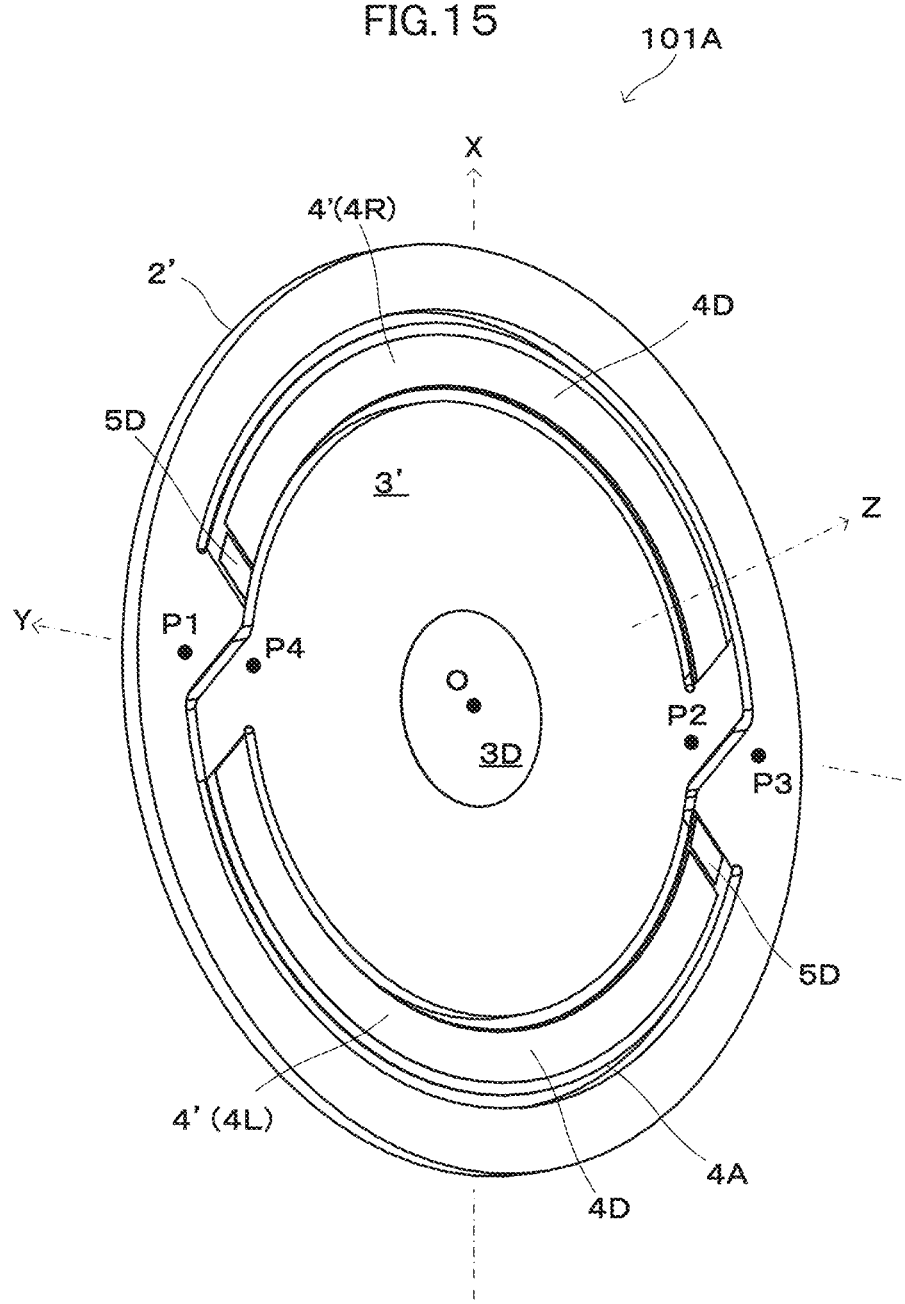
FIG. 15 is a perspective view of an ultrasonic sensor according to Embodiment 3 of the disclosure as viewed from the front.
Figure 16:
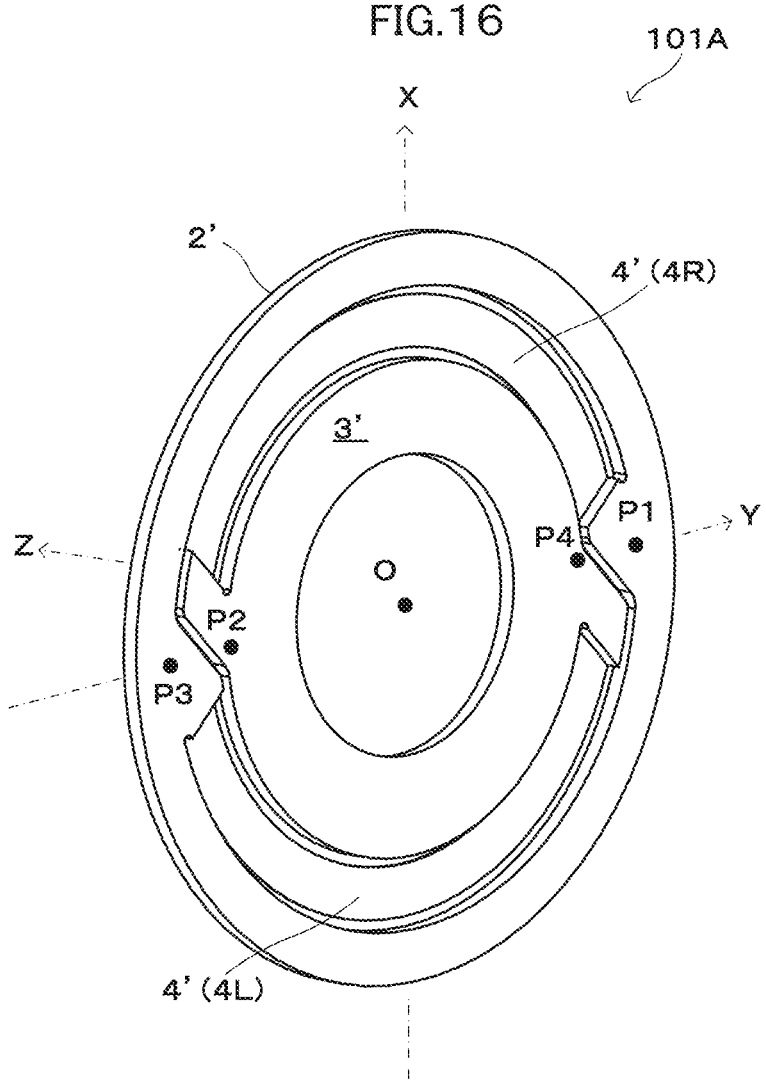
FIG. 16 is a perspective view of the ultrasonic sensor illustrated in FIG. 15 as viewed from the rear.

As illustrated in FIGS. 15 and 16, an ultrasonic sensor 101A is formed on a substrate and has a disk shape as a whole. The ultrasonic sensor 101A is fabricated by slitting a semiconductor substrate, which is an example of the substrate, to define a fixed frame 2', an ultrasonic oscillator 3', and actuator units 4'. That is, the fixed frame 2', the ultrasonic oscillator 3', and the actuator units 4' are formed on the same substrate.

The fixed frame 2' is an outermost frame and differs from the fixed frame 2 according to the above embodiments in that the fixed frame 2' has an annular shape. The ultrasonic oscillator 3' has a disk shape and is disposed inside the fixed frame 2'. The fixed frame 2' and the ultrasonic oscillator 3' are concentrically arranged. The actuator units 4' are a pair of protruding members disposed inside the fixed frame 2'. The actuator units 4' extend along the outer edge of the ultrasonic oscillator 3' in an arc shape.

The following description assumes a three-dimensional XYZ orthogonal coordinate system having the origin O at the gravitational center of the ultrasonic oscillator 3'. In this XYZ coordinate system, as illustrated in FIGS. 15 and 16, the direction of arrangement of the actuator units 4' relative to the ultrasonic oscillator 3' is defined as the X-axis direction, the direction orthogonal to the X axis in the plane of the ultrasonic sensor 101A is defined as the Y-axis direction, and the direction of the normal to the plane of the ultrasonic sensor 101A is defined as the Z-axis direction.

The ultrasonic oscillator 3' generates ultrasonic waves traveling in the +Z direction. The actuator units 4' are a pair of members 4R and 4L arranged on both sides of the ultrasonic oscillator 3' in the X-axis direction (first direction). The actuator units 4' couple the fixed frame 2' to the ultrasonic oscillator 3' and retain the ultrasonic oscillator 3'.

With reference to FIG. 16, the actuator units 4' have a thickness smaller than the thickness of the fixed frame 2'. The actuator units 4' have flexibility at least in the up-down direction (Z-axis direction). The actuator units 4' can thus be warped upward or downward, thereby causing the ultrasonic oscillator 3' to swing relative to the fixed frame 2' within a predetermined range.

The ultrasonic sensor 101A has a laminated structure including an A-layer 1A, a B-layer 1B, and a C-layer 1C stacked in the order mentioned, like the ultrasonic sensor 100A. The fixed frame 2', the ultrasonic oscillator 3', and the actuator units 4' have a three-layer structure including the A-layer 1A, the B-layer 1B, and the C-layer 1C, like the fixed frame 2, the ultrasonic oscillator 3, and the actuator units 4. The A-layer 1A of the actuator units 4' serves as the second substrate 4A while the B-layer 1B to the D-layer 1D serve as the second piezoelectric element (4B, 4C, 4D), as in the actuator units 4. The actuator units 4' also have a D-layer 1D that constitute detection electrodes 5D for detecting displacement of the actuator units 4'.

In each of the members 4R and 4L of the actuator units 4', the second substrate 4A extends from the inner edge of the fixed frame 2' along the outer edge of the ultrasonic oscillator 3' in an arc shape. The second piezoelectric element (4B, 4C, 4D) expands or contracts in the direction (arc direction) in which the second substrate 4A extends.

The pair of members 4R and 4L of the actuator units 4' are arranged in rotational symmetry of order two about the ultrasonic oscillator 3'. The member 4R of the pair of members 4R and 4L is bonded to the fixed frame 2' at a first position P1 located on one side of the center O of the ultrasonic oscillator 3' in the second direction (Y-axis direction). The member 4R is bonded to the ultrasonic oscillator 3' at a second position P2 located on the side of the center O of the ultrasonic oscillator 3' opposite to the first position P1.

The other member 4L of the pair of members 4R and 4L of the actuator units 4' is bonded to the fixed frame 2' at a third position P3 located on one side of the center O of the ultrasonic oscillator 3' in the second direction (Y-axis direction). The member 4L is bonded to the ultrasonic oscillator 3' at a fourth position P4 located on the side of the center O of the ultrasonic oscillator 3' opposite to the third position P3.

The members 4R and 4L of the actuator units 4' are arranged to face each other at both ends in their extending direction (arc direction). The facing outer edges intersect the straight line (Y axis) extending through the center O of the ultrasonic oscillator 3' in the second direction (Y-axis direction). This arrangement can dispose the first position P1, the second position P2, the third position P3, and the fourth position P4 on a straight line. The arrangement can thus match the direction of swing of the ultrasonic oscillator 3' caused by the member 4R with the direction of swing of the ultrasonic oscillator 3' caused by the member 4L as much as possible.

Figure 17:
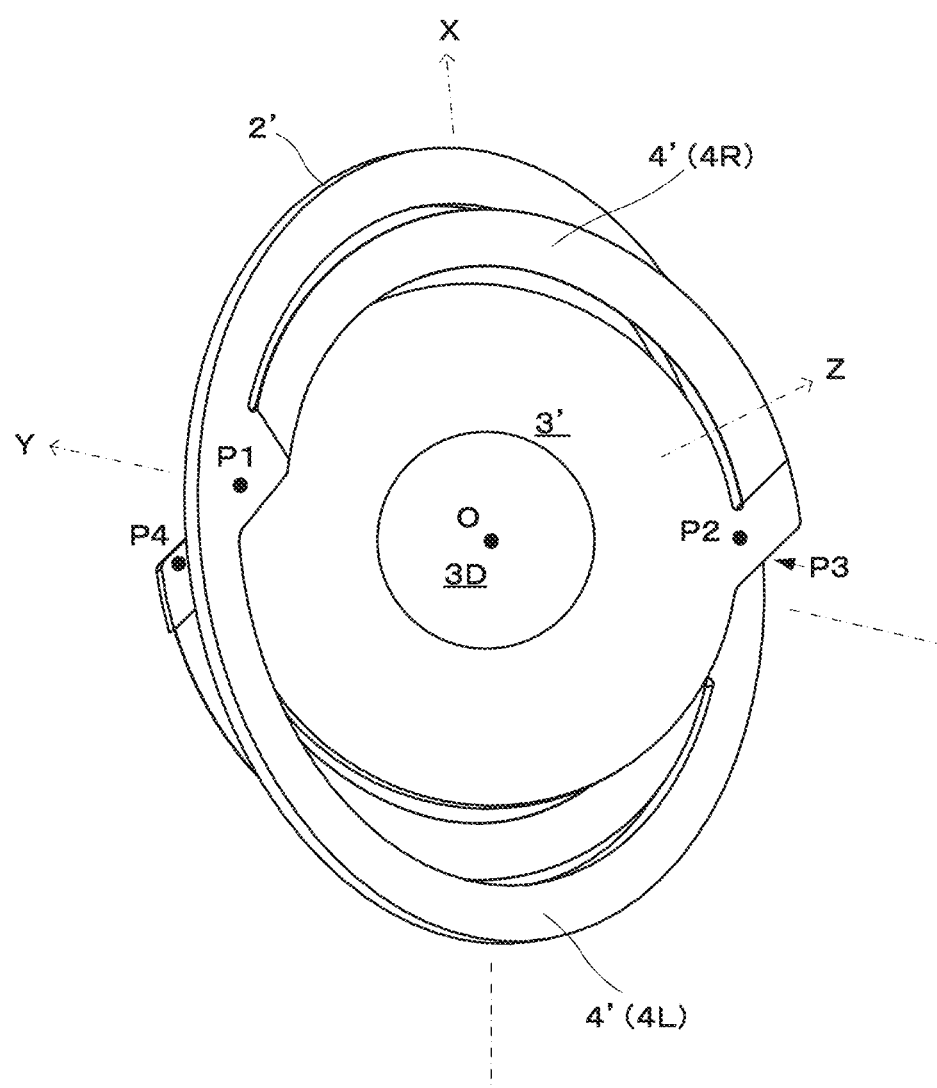
FIG. 17 is a perspective view illustrating a movement of the ultrasonic sensor according to Embodiment 3 of the disclosure.

The pair of members 4R and 4L of the actuator units 4' are deformed in response to expansion or contraction of the second piezoelectric element (4B, 4C, 4D). As illustrated in FIG. 17, this deformation shifts the second position P2 relative to the first position P1 toward the +Z direction and shifts the fourth position P4 relative to the third position P3 toward the −Z direction. This operation turns the ultrasonic oscillator 3' about the X axis in the counterclockwise direction. Then, the second position P2 moves relative to the first position P1 toward the −Z direction while the fourth position P4 moves relative to the third position P3 toward the +Z direction. This operation turns the ultrasonic oscillator 3' about the X axis in the clockwise direction. The pair of members 4R and 4L of the actuator units 4' repeat these movements, thereby causing the ultrasonic oscillator 3' to swing about the X axis. It should be noted that FIG. 17 does not illustrate the upper electrode layer 4D or the detection electrodes 5D.

The ultrasonic sensor 101A according to the embodiment is equipped with the actuator units 4' having an arc shape and extending along the outer edge of the ultrasonic oscillator 3', and the fixed frame 2' having an annular shape. This configuration can reduce the gaps between the fixed frame 2', the ultrasonic oscillator 3', and the actuator units 4', resulting in size reduction of the entire sensor. Although the fixed frame 2' has an annular shape according to the embodiment, the fixed frame 2' is only required to have an arc-shaped inner periphery extending along the outer edges of the actuator units 4' and may have a rectangular outer periphery.

Although the pair of members 4R and 4L of the actuator units 4' are arranged in rotational symmetry of order two about the center O according to the embodiment, this configuration should not be construed as limiting the disclosure. The pair of members 4R and 4L may also be arranged symmetrically about the Y axis.

Although the first position P1, the second position P2, the third position P3, and the fourth position P4 are located on the Y axis according to the embodiment, this configuration should not be construed as limiting the disclosure. These positions are not necessarily located on the Y axis provided that the actuator units 4' can cause the ultrasonic oscillator 3' to swing about the X axis.

Embodiment 4

Then, Embodiment 4 of the disclosure will now be described in detail with reference to the accompanying drawings.

Figure 18:
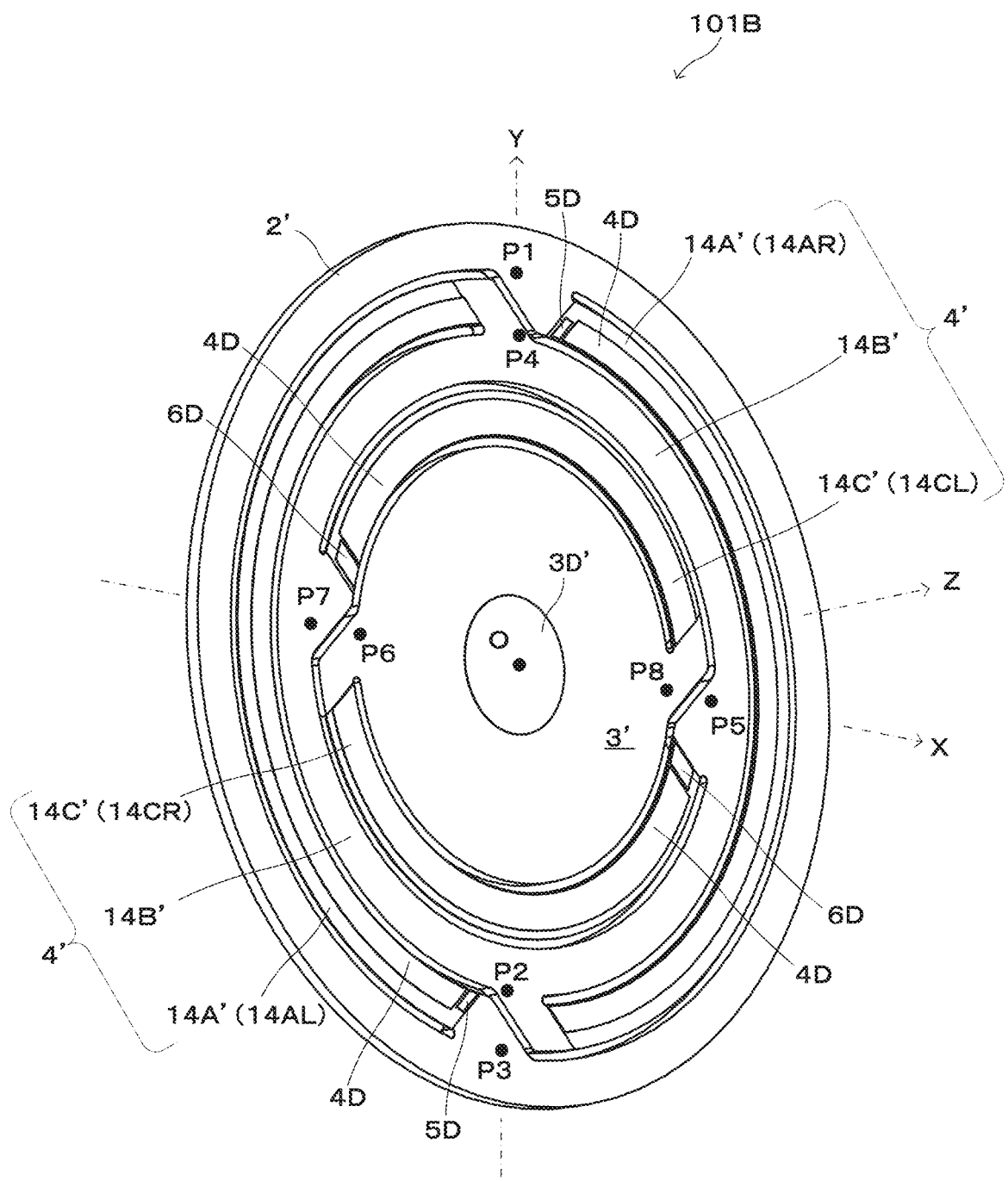
FIG. 18 is a perspective view of an ultrasonic sensor according to Embodiment 4 of the disclosure as viewed from the front.
Figure 19:
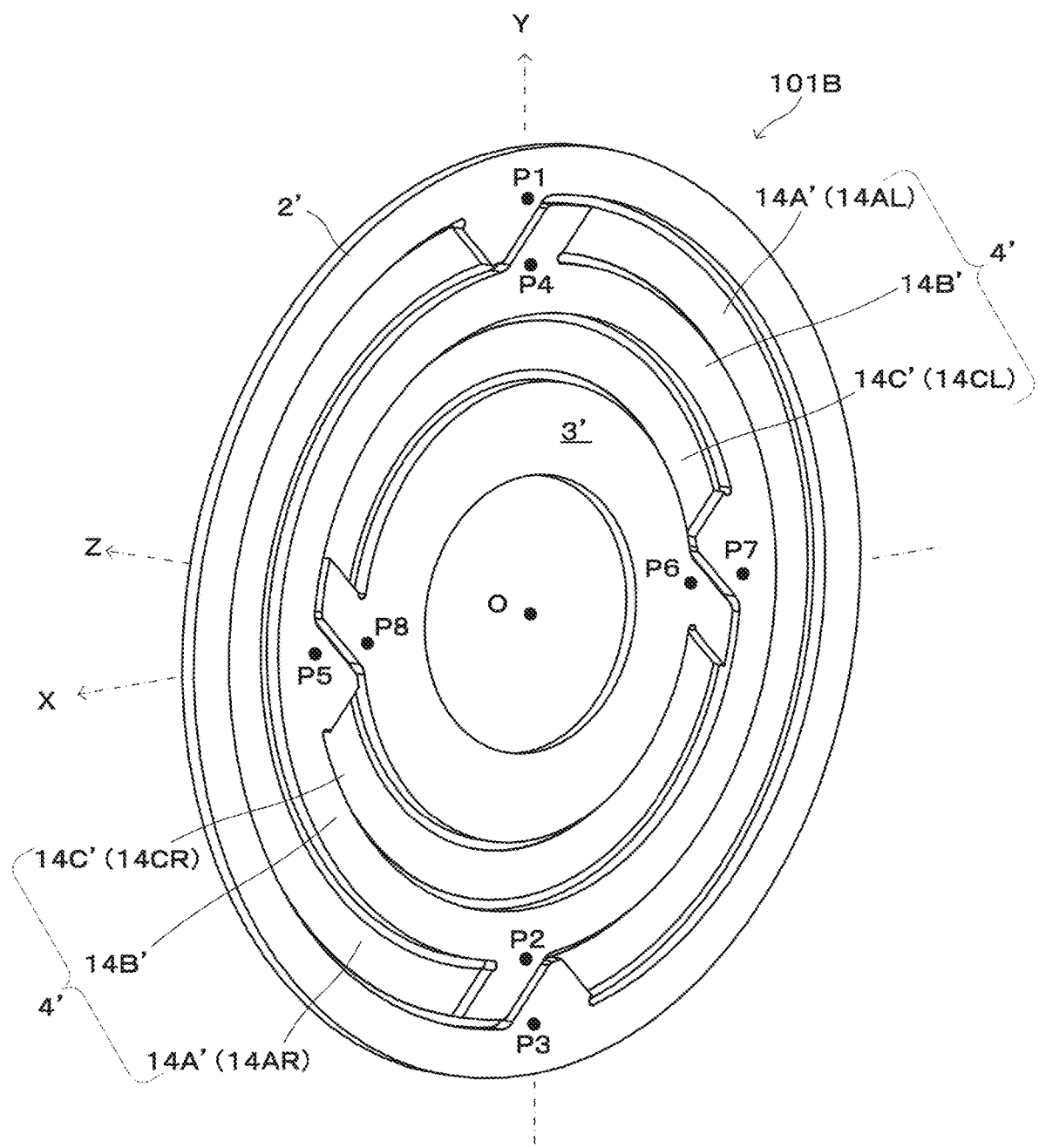
FIG. 19 is a perspective view of the ultrasonic sensor illustrated in FIG. 18 as viewed from the rear.

As illustrated in FIGS. 18 and 19, an ultrasonic sensor 101B according to Embodiment 4 differs from the ultrasonic sensor 101A according to Embodiment 3 in the configuration of the actuator units 4'. The actuator units 4' cause the ultrasonic oscillator 3' to swing not only about the X axis but also about the Y axis. That is, in the ultrasonic sensor 101B according to the embodiment, the actuator units 4' cause the ultrasonic oscillator 3' to swing in two directions.

According to the embodiment, the actuator units 4' include first actuators 14A', a movable frame 14B', and second actuators 14C'. The ultrasonic oscillator 3' according to the embodiment has a disk shape as in Embodiment 3. The movable frame 14B' has an annular shape and is arranged concentrically with the ultrasonic oscillator 3'.

The first actuators 14A' are arranged on both sides of the movable frame 14B' in the X-axis direction. Each of the first actuators 14A' is disposed between the fixed frame 2' and the movable frame 14B'. The first actuators 14A' couple the fixed frame 2' to the movable frame 14B' and cause the movable frame 14B' to swing relative to the fixed frame 2' about the X axis (first rotational axis). The first actuators 14A' have a configuration substantially identical to the configuration of the actuator units 4' according to Embodiment 3.

The movable frame 14B' is an annular frame composed of a part of the second substrate 4A. The movable frame 14B' is disposed inside the fixed frame 2' and surrounds the ultrasonic oscillator 3'.

The second actuators 14C' are arranged on both sides of the ultrasonic oscillator 3' in the Y-axis direction. Each of the second actuators 14C' is disposed between the movable frame 14B' and the ultrasonic oscillator 3'. The second actuators 14C' couple the movable frame 14B' to the ultrasonic oscillator 3' and cause the ultrasonic oscillator 3' to swing relative to the movable frame 14B' about the Y axis (second rotational axis).

In the ultrasonic sensor 101B according to Embodiment 4, each of the fixed frame 2', the ultrasonic oscillator 3', and the actuator units 4' (the first actuators 14A', the movable frame 14B', and the second actuators 14C') has a three-layer structure (refer to FIG. 9) including the A-layer 1A, the B-layer 1B, and the C-layer 1C. As illustrated in FIG. 19, the first actuators 14A' and the second actuators 14C' have a thickness smaller than the thickness of the fixed frame 2' and the movable frame 14B' so as to define gaps below the first actuators 14A' and the second actuators 14C'. These gaps allow for deformation of the first actuators 14A' and the second actuators 14C'. The thickness of the first actuators 14A' and the second actuators 14C' can be reduced, for example, by removing part of the support sublayer of the three sublayers (support sublayer, BOX sublayer, and active sublayer) included in the A-layer 1A.

The configuration of each component will now be described in more detail. The first actuators 14A' are a pair of members 14AR and 14AL that are arranged on both sides of the ultrasonic oscillator 3' in the first direction (X-axis direction) and that extend along the outer edge of the movable frame 14B' in an arc shape. In each of the members 14AR and 14AL of the first actuators 14A', the second substrate 4A extends from the inner edge of the fixed frame 2' along the outer edge of the movable frame 14B' in an arc shape. The second piezoelectric element (4B, 4C, 4D) expands or contracts in the direction (arc direction) in which the second substrate 4A extends.

The second actuators 14C' are arranged on both sides of the ultrasonic oscillator 3' in the second direction (Y-axis direction) orthogonal to the first direction (X-axis direction). The second actuators 14C' are a pair of members 14CR and 14CL that extend along the outer edge of the ultrasonic oscillator 3' in an arc shape. In each of the members 14CR and 14CL of the second actuators 14C', the second substrate 4A extends from the inner edge of the movable frame 14B' along the outer edge of the ultrasonic oscillator 3' in an arc shape. The second piezoelectric element (4B, 4C, 4D) expands or contracts in the direction (arc direction) in which the second substrate 4A extends.

The pair of members 14AR and 14AL of the first actuators 14A' are arranged in rotational symmetry of order two about the ultrasonic oscillator 3', while the pair of members 14CR and 14CL of the second actuators 14C' are arranged in rotational symmetry of order two about the ultrasonic oscillator 3'.

More specifically, the member 14AR of the pair of members 14AR and 14AL of the first actuators 14A' is bonded to the fixed frame 2' at a first position P1 located on one side of the center of the ultrasonic oscillator 3' in the second direction (Y-axis direction). The member 14AR is bonded to the movable frame 14B' at a second position P2 located on the side of the center of the ultrasonic oscillator 3' opposite to the first position P1. The other member 14AL of the pair of members 14AR and 14AL of the first actuators 14A' is bonded to the fixed frame 2' at a third position P3 located on one side of the center of the ultrasonic oscillator 3' in the second direction (Y-axis direction). The member 14AL is bonded to the movable frame 14B' at a fourth position P4 located on the side of the center of the ultrasonic oscillator 3' opposite to the third position P3.

The member 14CR of the pair of members 14CR and 14CL of the second actuators 14C' is bonded to the movable frame 14B' at a fifth position P5 located on one side of the center of the ultrasonic oscillator 3' in the first direction (X-axis direction). The member 14CR is bonded to the ultrasonic oscillator 3' at a sixth position P6 located on the side of the center of the ultrasonic oscillator 3' opposite to the fifth position P5. The other member 14CL of the pair of members 14CR and 14CL of the second actuators 14C' is bonded to the movable frame 14B' at a seventh position P7 located on one side of the center O of the ultrasonic oscillator 3' in the first direction (X-axis direction). The member 14CL is bonded to the ultrasonic oscillator 3' at an eighth position P8 located on the side of the center O of the ultrasonic oscillator 3' opposite to the seventh position P7.

The pair of members 14AR and 14AL of the first actuators 14A' are arranged to face each other at both ends in their extending direction (arc direction). The facing outer edges intersect the straight line (Y axis) extending through the center O of the ultrasonic oscillator 3' in the second direction (Y-axis direction). The pair of members 14CR and 14CL of the second actuators 14C' are arranged to face each other at both ends in their extending direction (arc direction). The facing outer edges intersect the straight line (X axis) extending through the center of the ultrasonic oscillator 3' in the first direction (X-axis direction). This arrangement can dispose the first to fourth positions P1-P4 on a straight line and dispose the fifth to eighth positions P5-P8 on a straight line. The arrangement can thus match the direction of swing of the ultrasonic oscillator 3' caused by the member 14AR with the direction of swing of the ultrasonic oscillator 3' caused by the member 14AL as much as possible. The arrangement can also match the direction of swing of the ultrasonic oscillator 3' caused by the member 14CR with the direction of swing of the ultrasonic oscillator 3' caused by the member 14CL as much as possible.

Figure 20:
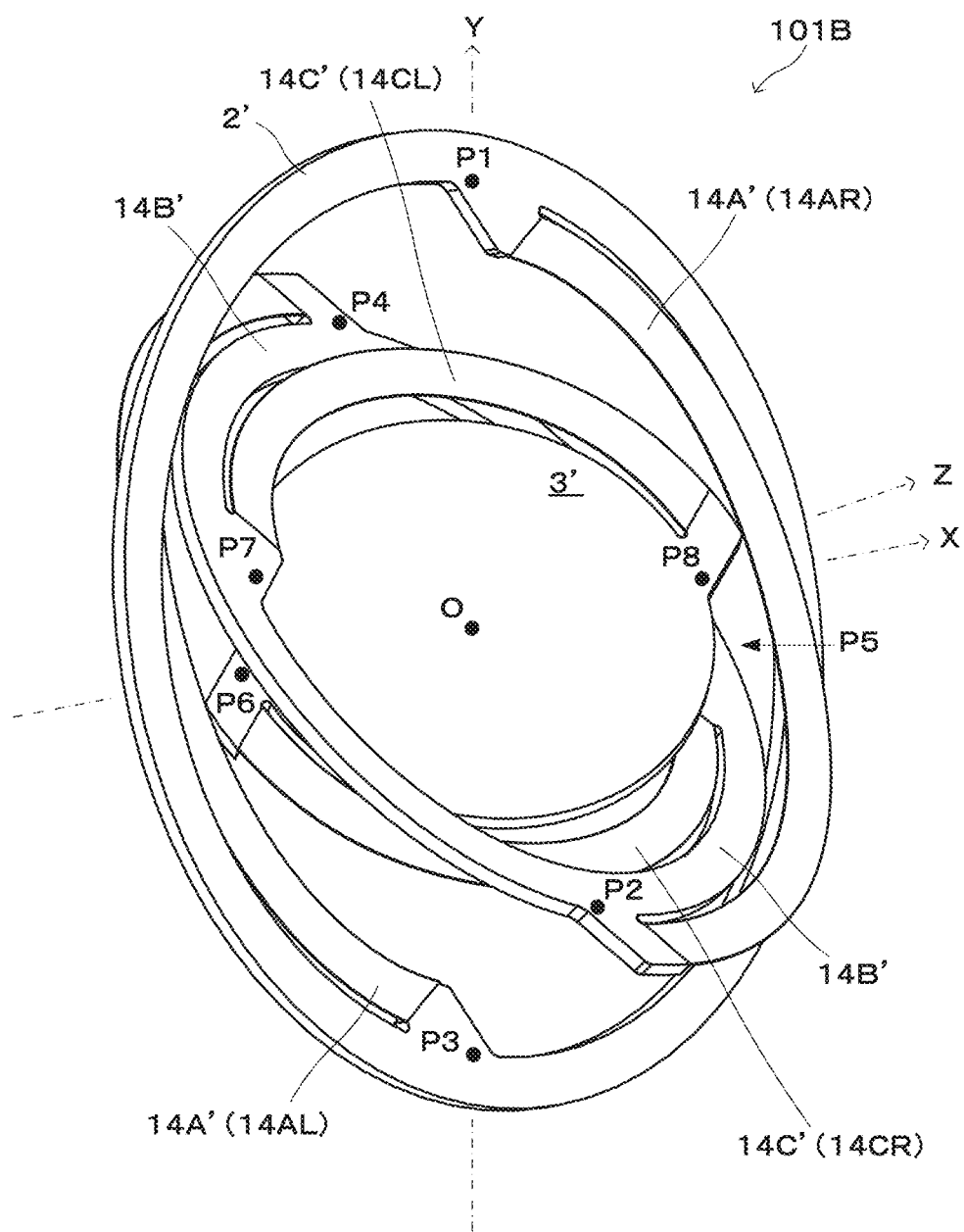
FIG. 20 is a perspective view illustrating a movement of the ultrasonic sensor according to Embodiment 4 of the disclosure.

The pair of members 14AR and 14AL of the first actuators 14A' are deformed in response to expansion or contraction of the second piezoelectric element (4B, 4C, 4D). As illustrated in FIG. 20, this deformation shifts the second position P2 relative to the first position P1 toward the +Z direction and shifts the fourth position P4 relative to the third position P3 toward the −Z direction. This operation turns the ultrasonic oscillator 3' about the X axis in the counterclockwise direction. Then, the second position P2 moves relative to the first position P1 toward the −Z direction while the fourth position P4 moves relative to the third position P3 toward the +Z direction. This operation turns the ultrasonic oscillator 3' about the X axis in the clockwise direction. The pair of members 14AR and 14AL of the first actuators 14A' repeat these movements, thereby causing the ultrasonic oscillator 3' to swing about the X axis.

The pair of members 14CR and 14CL of the second actuators 14C' are deformed in response to expansion or contraction of the second piezoelectric element (4B, 4C, 4D). As illustrated in FIG. 20, this deformation shifts the sixth position P6 relative to the fifth position P5 toward the +Z direction and shifts the eighth position P8 relative to the seventh position P7 toward the −Z direction. This operation turns the ultrasonic oscillator 3' about the Y axis in the counterclockwise direction. Then, the sixth position P6 moves relative to the fifth position P5 toward the −Z direction while the eighth position P8 moves relative to the seventh position P7 toward the +Z direction. This operation turns the ultrasonic oscillator 3' about the Y axis in the clockwise direction. The pair of members 14CR and 14CL of the second actuators 14C' repeat these movements, thereby causing the ultrasonic oscillator 3' to swing about the Y axis. It should be noted that FIG. 20 does not illustrate the upper electrode layer 4D or the detection electrodes 5D.

The ultrasonic sensor 101B according to the embodiment is equipped with the first actuators 14A', the movable frame 14B', and the second actuators 14C' having an arc or annular shape and extending along the outer edge of the ultrasonic oscillator 3'. This configuration can reduce the gaps between the fixed frame 2', the ultrasonic oscillator 3', and the actuator units 4'. The annular shape of the fixed frame 2' leads to further size reduction of the entire sensor. Although the fixed frame 2' has an annular shape according to the embodiment, the fixed frame 2' is only required to have an arc-shaped inner periphery extending along the outer edges of the actuator units 4' and may have a rectangular outer periphery.

Although the pair of members 14AR and 14AL of the first actuators 14A' are arranged in rotational symmetry of order two about the center O according to the embodiment, this configuration should not be construed as limiting the disclosure. The pair of members 14AR and 14AL may also be arranged symmetrically about the Y axis. Although the pair of members 14CR and 14CL of the second actuators 14C' are arranged in rotational symmetry of order two about the center O according to the embodiment, this configuration should not be construed as limiting the disclosure. The pair of members 14CR and 14CL may also be arranged symmetrically about the X axis.

Although the first position P1, the second position P2, the third position P3, and the fourth position P4 are located on the Y axis according to the embodiment, this configuration should not be construed as limiting the disclosure. These positions are not necessarily located on the Y axis provided that the actuator units 4' can cause the ultrasonic oscillator 3' to swing about the X axis. Although the fifth position P5, the sixth position P6, the seventh position P7, and the eighth position P8 are located on the X axis according to the embodiment, this configuration should not be construed as limiting the disclosure. These positions are not necessarily located on the X axis provided that the actuator units 4' can cause the ultrasonic oscillator 3' to swing about the Y axis.

In the ultrasonic sensors 100A to 100F, 101A, and 101B according to the above embodiments, the ultrasonic oscillator 3 or 3' and the actuator units 4 or 4' are integrated with each other (simultaneously fabricated in a semiconductor manufacturing process). This configuration can simplify the process and reduce the required space during assembly. The driving operation using a piezoelectric thin film can yield large displacement regardless of low voltage. The actuator units 4 or 4' having an arc shape can contribute to size reduction.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2017-185756, filed on Sep. 27, 2017, the entire disclosure of which is incorporated by reference herein.

INDUSTRIAL APPLICABILITY

The disclosure can be applied to apparatuses that generate ultrasonic waves.

REFERENCE SIGNS LIST

1A A-layer
1B B-layer
1C C-layer
1D D-layer
2, 2' Fixed frame
3, 3' Ultrasonic oscillator
3A First substrate
3B Lower electrode layer
3C Piezoelectric material layer
3D Upper electrode layer
4, 4' Actuator unit
4A Second substrate
4B Lower electrode layer
4C Piezoelectric material layer
4D Upper electrode layer
4R, 4L Member
5D Detection electrode
6D Detection electrode
14A, 14A' First actuator
14B, 14B' Movable frame
14C, 14C' Second actuator
14AR, 14AL Member
14CR, 14CL Member
41 Distal arm section
42 Proximal arm section
43 Middle arm section
51 Distal arm section
52 Proximal arm section
53 Middle arm section
100A, 100B, 100C, 100D, 100E, 100F, 101A, 101B Ultrasonic sensor

The invention claimed is:

1. An ultrasonic sensor comprising:
a fixed frame fixed to an external member;
an ultrasonic oscillator disposed inside the fixed frame, the ultrasonic oscillator comprising a flexible first substrate and a first piezoelectric element deposited on the first substrate in a form of a thin film, the ultrasonic oscillator being configured to be warped in response to expansion or contraction of the first piezoelectric element and generate ultrasonic waves; and
actuator units comprising a flexible second substrate coupling the first substrate to the fixed frame and a second piezoelectric element deposited on the second substrate in a form of a thin film, the actuator units being configured to be warped in response to expansion or contraction of the second piezoelectric element and cause the ultrasonic oscillator to swing relative to the fixed frame, wherein
the first substrate has an outer periphery part bonded to the actuator units and an inner periphery part provided with the first piezoelectric element, the inner periphery part having a thickness smaller than the outer periphery part so as to be warped in response to expansion or contraction of the first piezoelectric element and generate ultrasonic waves.

2. The ultrasonic sensor according to claim 1, wherein the fixed frame, the ultrasonic oscillator, and the actuator units are arranged in a same plane.

3. The ultrasonic sensor according to claim 1, wherein the actuator units cause the ultrasonic oscillator to swing in one direction.

4. The ultrasonic sensor according to claim 3, wherein
the actuator units comprise a pair of linear members disposed on both sides of the ultrasonic oscillator in a first direction,
each of the members comprises a section in which the second substrate extends from an inner edge of the fixed frame in a second direction intersecting the first direction, the section being provided with the second piezoelectric element in a form of a thin film, the second piezoelectric element expanding or contracting in the second direction, and
the members are configured to be deformed in response to expansion or contraction of the second piezoelectric element and cause the ultrasonic oscillator to swing.

5. The ultrasonic sensor according to claim 4, wherein the section of each of the members extending in the second direction has a length larger than a distance in the second direction from a joint between a corresponding one of the actuator units and the inner edge of the fixed frame to a midpoint of an outer edge of the ultrasonic oscillator.

6. The ultrasonic sensor according to claim 3, wherein
the ultrasonic oscillator has a disk shape,
the actuator units comprise a pair of members extending in a direction along an outer edge of the ultrasonic oscillator in an arc shape, the members being disposed on both sides of the ultrasonic oscillator in a first direction,
in each of the members, the second substrate extends from an inner edge of the fixed frame in the direction along the outer edge of the ultrasonic oscillator in an arc shape, the second piezoelectric element expanding or contracting in the direction in which the second substrate extends, and
the members are configured to be deformed in response to expansion or contraction of the second piezoelectric element and cause the ultrasonic oscillator to swing.

7. The ultrasonic sensor according to claim 6, wherein the pair of members are arranged in rotational symmetry of order two about the ultrasonic oscillator.

8. The ultrasonic sensor according to claim 7, wherein
one of the pair of members is bonded to the fixed frame at a first position located on one side of a center of the ultrasonic oscillator in a second direction orthogonal to the first direction and is bonded to the ultrasonic oscillator at a second position located on another side of the center of the ultrasonic oscillator opposite to the first position, and
another of the pair of members is bonded to the fixed frame at a third position located on one side of the center of the ultrasonic oscillator in the second direction and is bonded to the ultrasonic oscillator at a fourth position located on another side of the center of the ultrasonic oscillator opposite to the third position.

9. The ultrasonic sensor according to claim 8, wherein
the one and the other of the pair of members are arranged to face each other at both ends in an extending direction, and
facing outer edges intersect a straight line extending through the center of the ultrasonic oscillator in the second direction.

10. The ultrasonic sensor according to claim 1, wherein the actuator units cause the ultrasonic oscillator to swing in two directions.

11. The ultrasonic sensor according to claim 10, wherein the actuator units comprise:
a movable frame comprising a part of the second substrate;
first actuators coupling the fixed frame to the movable frame, the first actuators being configured to cause the movable frame to swing relative to the fixed frame about a first rotational axis; and
second actuators coupling the movable frame to the ultrasonic oscillator, the second actuators being configured to cause the ultrasonic oscillator to swing relative to the movable frame about a second rotational axis different from the first rotational axis.

12. The ultrasonic sensor according to claim 11, wherein
the first actuators comprise a pair of linear members disposed on both sides of the movable frame in a first direction,
each of the members of the first actuators comprises a section in which the second substrate extends from an inner edge of the fixed frame in a second direction intersecting the first direction, the section being provided with the second piezoelectric element in a form of a thin film, the second piezoelectric element expanding or contracting in the second direction,
the second substrate of the members of the first actuators is configured to be deformed in response to expansion or contraction of the second piezoelectric element and cause the movable frame to swing about the first rotational axis,
the second actuators comprise a pair of linear members disposed on both sides of the ultrasonic oscillator in the second direction,
each of the members of the second actuators comprises a section in which the second substrate extends from an inner edge of the movable frame in the first direction, the section being provided with the second piezoelectric element in a form of a thin film, the second piezoelectric element expanding or contracting in the first direction, and
the members of the second actuators are configured to be deformed in response to expansion or contraction of the second piezoelectric element and cause the ultrasonic oscillator to swing about the second rotational axis.

13. The ultrasonic sensor according to claim 12, wherein the section of each of the first actuators extending in the second direction has a length larger than a distance in the second direction from a joint between the first actuator and the inner edge of the fixed frame to a midpoint of an outer edge of the movable frame.

14. The ultrasonic sensor according to claim 12, wherein the section of each of the second actuators extending in the first direction has a length larger than a distance in the first direction from a joint between the second actuator and the inner edge of the movable frame to a midpoint of an outer edge of the ultrasonic oscillator.

15. The ultrasonic sensor according to claim 11, wherein
the ultrasonic oscillator has a disk shape,
the movable frame has an annular shape and is arranged concentrically with the ultrasonic oscillator,
the first actuators comprise a pair of members extending in a direction along an outer edge of the movable frame in an arc shape, the members being disposed on both sides of the ultrasonic oscillator in a first direction,
in each of the members of the first actuators, the second substrate extends from an inner edge of the fixed frame in the direction along the outer edge of the movable frame in an arc shape, the second piezoelectric element expanding or contracting in the direction in which the second substrate extends,
the members of the first actuators are configured to be deformed in response to expansion or contraction of the second piezoelectric element and cause the movable frame to swing about the first rotational axis,
the second actuators comprise a pair of members extending in a direction along an outer edge of the ultrasonic oscillator in an arc shape, the members being disposed on both sides of the ultrasonic oscillator in a second direction orthogonal to the first direction,
in each of the members of the second actuators, the second substrate extends from an inner edge of the movable frame in the direction along the outer edge of the ultrasonic oscillator in an arc shape, the second piezoelectric element expanding or contracting in the direction in which the second substrate extends, and
the members of the second actuators are configured to be deformed in response to expansion or contraction of the second piezoelectric element and cause the ultrasonic oscillator to swing about the second rotational axis.

16. The ultrasonic sensor according to claim 15, wherein
the pair of members of the first actuators are arranged in rotational symmetry of order two about the ultrasonic oscillator, and
the pair of members of the second actuators are arranged in rotational symmetry of order two about the ultrasonic oscillator.

17. The ultrasonic sensor according to claim 16, wherein
one of the pair of members of the first actuators is bonded to the fixed frame at a first position located on one side of a center of the ultrasonic oscillator in the second direction and is bonded to the movable frame at a second position located on another side of the center of the ultrasonic oscillator opposite to the first position,
another of the pair of members of the first actuators is bonded to the fixed frame at a third position located on one side of the center of the ultrasonic oscillator in the second direction and is bonded to the movable frame at a fourth position located on another side of the center of the ultrasonic oscillator opposite to the third position,
one of the pair of members of the second actuators is bonded to the movable frame at a fifth position located on one side of the center of the ultrasonic oscillator in the first direction and is bonded to the ultrasonic oscillator at a sixth position located on another side of the center of the ultrasonic oscillator opposite to the fifth position, and
another of the pair of members of the second actuators is bonded to the movable frame at a seventh position located on one side of the center of the ultrasonic oscillator in the first direction and is bonded to the ultrasonic oscillator at an eighth position located on another side of the center of the ultrasonic oscillator opposite to the seventh position.

18. The ultrasonic sensor according to claim 17, wherein
the one and the other of the pair of members of the first actuators are arranged to face each other at both ends in an extending direction, and facing outer edges intersect a straight line extending through the center of the ultrasonic oscillator in the second direction.

19. The ultrasonic sensor according to claim 17, wherein
the one and the other of the pair of members of the second actuators are arranged to face each other at both ends in an extending direction, and facing outer edges intersect a straight line extending through the center of the ultrasonic oscillator in the first direction.

\* \* \* \* \*